(12) United States Patent
Nowatari et al.

(10) Patent No.: US 10,403,843 B2
(45) Date of Patent: Sep. 3, 2019

(54) LIGHT-EMITTING ELEMENT COMPRISING THE FIRST TO THIRD LAYER AND EL LAYER

(71) Applicant: Semiconductor Energy Laboratory Co., Ltd., Atsugi-shi, Kanagawa-ken (JP)

(72) Inventors: Hiromi Nowatari, Atsugi (JP); Satoshi Seo, Kawasaki (JP); Nobuharu Ohsawa, Zama (JP); Tetsuo Tsutsui, Kasuga (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 49 days.

(21) Appl. No.: 14/483,635

(22) Filed: Sep. 11, 2014

(65) Prior Publication Data

US 2014/0374737 A1     Dec. 25, 2014

Related U.S. Application Data

(63) Continuation of application No. 13/415,055, filed on Mar. 8, 2012, now Pat. No. 8,835,973, which is a
(Continued)

(30) Foreign Application Priority Data

Dec. 1, 2008 (JP) .................................. 2008-306153
May 29, 2009 (JP) .................................. 2009-130539

(51) Int. Cl.
  *H01L 51/50*   (2006.01)
  *H01L 51/00*   (2006.01)

(52) U.S. Cl.
  CPC ........ *H01L 51/5068* (2013.01); *H01L 51/002* (2013.01); *H01L 51/50* (2013.01);
(Continued)

(58) Field of Classification Search
  CPC ............ H01L 51/5068; H01L 51/0092; H01L 51/5056; H01L 51/506
(Continued)

(56) References Cited

U.S. PATENT DOCUMENTS 6,013,384 A    1/2000  Kido et al.
6,137,223 A   10/2000  Hung et al.
(Continued)

FOREIGN PATENT DOCUMENTS

CN    001620212 A    5/2005
CN    001943057 A    4/2007
(Continued)

OTHER PUBLICATIONS

Nowatari.H et al., "60.2: Intermediate Connector With Suppressed Voltage Loss for White TANDEM OLEDS", SID Digest '09 : SID International Symposium Digest of Technical Papers, May 31, 2009, vol. 40, pp. 899-902.
(Continued)

*Primary Examiner* — Andres Munoz
(74) *Attorney, Agent, or Firm* — Robinson Intellectual Propert Law Office; Eric J. Robinson

(57) ABSTRACT

Light-emitting elements in which an increase of driving voltage can be suppressed are provided. Light-emitting devices whose power consumption is reduced by including such light-emitting elements are also provided. In a light-emitting element having an EL layer between an anode and a cathode, a first layer in which carriers can be produced is formed between the cathode and the EL layer and in contact with the cathode, a second layer which transfers electrons produced in the first layer is formed in contact with the first layer, and a third layer which injects the electrons received from the second layer into the EL layer is formed in contact with the second layer.

20 Claims, 14 Drawing Sheets

Related U.S. Application Data continuation of application No. 12/627,142, filed on Nov. 30, 2009, now Pat. No. 8,158,991.

(52) U.S. Cl.
CPC ........ *H01L 51/506* (2013.01); *H01L 51/5092* (2013.01); *H01L 51/0053* (2013.01)

(58) Field of Classification Search
USPC ............... 438/98; 313/506; 257/40, E51.018
See application file for complete search history.

(56) References Cited

U.S. PATENT DOCUMENTS

| | | | |
|---|---|---|---|
| 7,192,659 B2 | 3/2007 | Ricks et al. | |
| 7,462,883 B2 | 12/2008 | Kumaki et al. | |
| 7,494,722 B2 | 2/2009 | Liao et al. | |
| 7,564,052 B2 | 7/2009 | Kumaki | |
| 7,902,742 B2 | 3/2011 | Suzuki et al. | |
| 7,964,891 B2 | 6/2011 | Kumaki et al. | |
| 7,985,974 B2 | 7/2011 | Nowatari et al. | |
| 8,164,088 B2 | 4/2012 | Ohsawa et al. | |
| 8,207,555 B2 | 6/2012 | Kumaki et al. | |
| 8,299,272 B2 | 10/2012 | Miura et al. | |
| 8,314,548 B2 | 11/2012 | Suzuki et al. | |
| 8,338,196 B2 | 12/2012 | Kumaki et al. | |
| 8,563,855 B2 | 10/2013 | Pschirer et al. | |
| 8,587,193 B2 | 11/2013 | Suzuki et al. | |
| 8,618,574 B2 | 12/2013 | Kumaki et al. | |
| 8,742,407 B2 | 6/2014 | Ohsawa et al. | |
| 8,786,183 B2 | 7/2014 | Suzuki et al. | |
| 8,946,698 B2 | 2/2015 | Ohsawa et al. | |
| 9,041,282 B2 | 5/2015 | Suzuki et al. | |
| 9,196,850 B2 | 11/2015 | Matsumoto et al. | |
| 2004/0137271 A1* | 7/2004 | Sohn | C08G 61/124 428/690 |
| 2005/0017628 A1* | 1/2005 | Prakash | H01L 51/5203 313/504 |
| 2005/0023961 A1* | 2/2005 | Pichler | C08G 61/00 313/503 |
| 2005/0098207 A1 | 5/2005 | Matsumoto et al. | |
| 2005/0104511 A1 | 5/2005 | Liao et al. | |
| 2006/0008740 A1 | 1/2006 | Kido et al. | |
| 2006/0188745 A1 | 8/2006 | Liao et al. | |
| 2006/0251922 A1 | 11/2006 | Liao et al. | |
| 2006/0292394 A1* | 12/2006 | Iwaki | H01L 51/5052 428/690 |
| 2007/0020483 A1 | 1/2007 | Park et al. | |
| 2007/0040161 A1* | 2/2007 | Kumaki | H01L 51/5203 257/13 |
| 2007/0072000 A1 | 3/2007 | Mochizuki et al. | |
| 2007/0090376 A1 | 4/2007 | Kumaki et al. | |
| 2007/0114512 A1* | 5/2007 | Kumaki | H01L 51/5052 257/13 |
| 2007/0114527 A1 | 5/2007 | Kumaki et al. | |
| 2007/0200125 A1 | 8/2007 | Ikeda et al. | |
| 2007/0210322 A1 | 9/2007 | Ohsawa et al. | |
| 2007/0241665 A1* | 10/2007 | Sakanoue | H01L 51/5092 313/503 |
| 2008/0278064 A1 | 11/2008 | Kumaki et al. | |
| 2009/0026922 A1 | 1/2009 | Iwaki et al. | |
| 2009/0072720 A1* | 3/2009 | Lee | H01L 51/5044 313/504 |
| 2009/0128024 A1 | 5/2009 | Fukuoka et al. | |
| 2009/0191427 A1* | 7/2009 | Liao | H01L 51/5096 428/690 |
| 2011/0081478 A1 | 4/2011 | Mochizuki et al. | |
| 2012/0199819 A1 | 8/2012 | Ohsawa et al. | |

FOREIGN PATENT DOCUMENTS

| | | |
|---|---|---|
| CN | 101034736 A | 9/2007 |
| CN | 101128936 A | 2/2008 |
| CN | 101203968 A | 6/2008 |
| CN | 101427399 A | 5/2009 |
| EP | 1530245 A | 5/2005 |
| EP | 1617493 A | 1/2006 |
| EP | 1624502 A | 2/2006 |
| EP | 1833104 A | 9/2007 |
| EP | 1851801 A | 11/2007 |
| EP | 1865566 A | 12/2007 |
| EP | 1876659 A | 1/2008 |
| EP | 2020694 A | 2/2009 |
| EP | 2256841 A | 12/2010 |
| JP | 04-297076 A | 10/1992 |
| JP | 10-270171 A | 10/1998 |
| JP | 2000-306676 A | 11/2000 |
| JP | 2005-129380 A | 5/2005 |
| JP | 2005-209643 A | 8/2005 |
| JP | 2006-074022 A | 3/2006 |
| JP | 2006-156997 A | 6/2006 |
| JP | 2007-165171 A | 6/2007 |
| JP | 2007-238563 A | 9/2007 |
| JP | 2007-273969 A | 10/2007 |
| JP | 2008-166687 A | 7/2008 |
| JP | 2008-532229 | 8/2008 |
| JP | 2008-219033 A | 9/2008 |
| KR | 2007-0092135 A | 9/2007 |
| KR | 2007-0114720 A | 12/2007 |
| KR | 2008-0111485 A | 12/2008 |
| TW | 200803009 | 1/2008 |
| TW | 200810596 | 2/2008 |
| WO | WO-2001/015244 | 3/2001 |
| WO | WO-2005/041320 | 5/2005 |
| WO | WO-2005/109543 | 11/2005 |
| WO | WO-2006/009262 | 1/2006 |
| WO | WO-2006/049323 | 5/2006 |
| WO | WO-2006/091560 | 8/2006 |
| WO | WO-2006/115232 | 11/2006 |
| WO | WO-2007/123061 | 11/2007 |
| WO | WO-2007/130047 | 11/2007 |

OTHER PUBLICATIONS

Matsumoto.T et al., "27.5L: Late-News Paper: Multiphoton Organic EL Device Having Charge Generation Layer", SID Digest '03 : SID International Symposium Digest of Technical Papers, 2003, vol. 34, pp. 979-981.

Tsutsui.T et al., "Electric Field-Assisted Bipolar Charge Spouting in Organic Thin-Film Diodes", Appl. Phys. Lett. (Applied Physics Letters) , Jan. 19, 2004, vol. 84, No. 3, pp. 440-442.

Chang.C et al., "Highly Efficient White Organic Electroluminescent Devices Based on TANDEM Architecture", Appl. Phys. Lett. (Applied Physics Letters) , Dec. 12, 2005, vol. 87, No. 25, pp. 253501-1-253501-3.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Liao.L et al., "High-efficiency tandem organic light-emitting diodes", Appl. Phys. Lett. (Applied Physics Letters) , Jan. 12, 2004, vol. 84, No. 2, pp. 167-169.

Terai.M et al., "Electric-Field-Assisted Bipolar Charge Generation From Internal Charge Separation Zone Composed of Doped Organic Bilayer", Appl. Phys. Lett. (Applied Physics Letters) , Feb. 21, 2007, vol. 90, pp. 083502-1-083502-3.

Law.C et al., "Effective organic-based connection unit for stacked organic light-emitting devices", Appl. Phys. Lett. (Applied Physics Letters) , Sep. 28, 2006, vol. 89, No. 13, pp. 133511-1-133511-3.

Leem.D et al., "Highly Efficient Tandem P-I-N Organic Light-Emitting Diodes Adopting a Low Temperature Evaporated Rhenium Oxide Interconnecting Layer", Appl. Phys. Lett. (Applied Physics Letters) , Sep. 8, 2008, vol 93, No. 10, pp. 103304-1-103304-3.

Birnstock.J et al., "54.3: Distinguished Paper: White Stacked OLED With 35 LM/W and 100,000 Hours Lifetime at 1000 CD/M2 for Display and Lighting Applications", SID Digest '08 : SID International Symposium Digest of Technical Papers, May 20, 2008, vol. 39, pp. 822-825.

(56) References Cited

OTHER PUBLICATIONS

Lai.S et al., "Copper Hexadecafluorophthalocyanine and Copper Phthalocyanine as a Pure Organic Connecting Unit in Blue TANDEM Organic Light-Emitting Devices", J. Appl Phys. (Journal of Applied Physics), 2007, vol. 101, pp. 014509-1-014509-4.

Kanno.H et al., "High Efficiency Stacked Organic Light-Emitting Diodes Employing Li2O as a Connecting Layer", Jpn. J. Appl. Phys. (Japanese Journal of Applied Physics), Dec. 7, 2006, vol. 45, No. 12, pp. 9219-9223.

Liao.L et al., "Power Efficiency Improvement in a TANDEM Organic Light-Emitting Diode", Appl. Phys. Lett. (Applied Physics Letters), Jun. 2, 2008, vol. 92, No. 22, pp. 223311-1-223311-3.

Chan.M et al., "Influences of Connecting Unit Architecture on the Performance of TANDEM Organic Light-Emitting Devices", Adv. Funct. Mater. (Advanced Functional Materials), 2007, vol. 17, No. 14, pp. 2509-2514.

Hiramoto.M et al., "P-I-N Like Behavior in Three-Layered Organic Solar Cells Having a Co-Deposited Interlater of Pigments", J. Appl. Phys. (Journal of Applied Physics), Oct. 15, 1992, vol. 72, No. 8, pp. 3781-3787.

Brabec.C et al., "Photovoltaic Properties of Conjugated Polymer/ Methanofullerene Composites Embedded in a Polystyrene Matrix", J. Appl. Phys. (Journal of Applied Physics), May 1, 1999, vol. 85, No. 9, pp. 6866-6872.

Search Report (Application No. 09177561.9) dated Mar. 11, 2010.

Ikeda.H et al., "P-185:Low-Drive-Voltage OLEDS with a Buffer Layer Having Molybdenum Oxide", SID Digest '06 : SID International Symposium Digest of Technical Papers, 2006, vol. 37, pp. 923-926.

Chinese Office Action (Application No. 200910251244.6) dated Jun. 5, 2013.

Chinese Office Action (Application No. 200910251244.6) dated Feb. 24, 2014.

Chinese Office Action (Application No. 201510172639.2) dated Jul. 4, 2016.

\* cited by examiner

LIGHT-EMITTING ELEMENT COMPRISING THE FIRST TO THIRD LAYER AND EL LAYER

BACKGROUND OF THE INVENTION

1. Field of the Invention

The present invention relates to a light-emitting element in which an organic compound is provided between a pair of electrodes and the organic compound exhibits luminescence by application of electric field. Further, the present invention relates to a light-emitting device having such a light-emitting element. Furthermore, the present invention relates to an electronic device and a lighting device having such a light-emitting device.

2. Description of the Related Art

Light-emitting elements, which use organic compounds as light emitters and have features of thinness, lightweight, fast response, and direct current low voltage driving, are expected to be applied to next-generation flat panel displays. In particular, display devices having light-emitting elements arranged in matrix are considered to be superior to conventional liquid crystal display devices, because they have wide viewing angle and excellent visibility.

A light emission mechanism of a light-emitting element is described below: when voltage is applied to a pair of electrodes with an EL layer including a light emitter interposed therebetween, electrons injected from a cathode and holes injected from an anode are recombined at an emission center in the EL layer to form molecular exciton, and energy is released when the molecular exciton relaxes to the ground state and thus light is emitted. An excited singlet state and an excited triplet state are known as an excited state, and it is thought that light can be emitted through either state.

As for such a light-emitting element, improvement of an element structure, a development of a material, and the like have been conducted in order to improve element characteristics.

For example, it is reported that an organic compound included in an electron-injecting layer formed in contact with a cathode, is doped with a metal having a low work function, such as an alkali metal, an alkaline earth metal or a rare earth metal, so that injection barrier can be reduced in injection of electrons from the cathode into the electron-injecting layer including an organic compound and thus driving voltage can be reduced (e.g., see Patent Document 1).

Further, it is also reported that an optical adjustment of an emission spectrum can be conducted without increase of a driving voltage, in relation to the above-described technology (e.g., see Patent Document 2).

Specifically, between a cathode and an EL layer in a light-emitting element, a layer in which a hole-transporting organic compound is doped with a metal oxide is formed in contact with the cathode, and a layer in which an electron-transporting organic compound is doped with a metal having a low work function, such as an alkali metal, an alkaline earth metal, or a rare earth metal, is formed so as to be in contact with the layer doped with metal oxide, and the thickness of the layer doped with metal oxide is increased to conduct an optical adjustment of an emission spectrum. In this case, because the hole-transporting organic compound has higher carrier mobility than the electron-transporting organic compound, an increase of driving voltage can be more suppressed than in a case where the thickness of the layer in which the electron-transporting organic compound is doped with a metal having low work function is increased.

REFERENCE

Patent Documents

[Patent Document 1] Japanese Published Patent Application No. H10-270171
[Patent Document 2] Japanese Published Patent Application No. 2005-209643

SUMMARY OF THE INVENTION

However, in the structure as in Patent Document 2 in which a layer including an acceptor substance and a layer including a donor substance are in contact with each other, influence on spatial structure (production of p-n junction leads to formation of a depletion layer due to carrier movement) or interactive functional interference between the acceptor substance and the donor substance causes an increase of driving voltage unfortunately.

In view of the above-described problem, it is an object of one embodiment of the present invention to provide light-emitting elements in which an increase of diving voltage can be suppressed. In addition, it is another object to provide light-emitting devices whose power consumption is reduced by including such light-emitting elements.

It is an object of one embodiment of the present invention to provide light-emitting elements in which an increase of driving voltage can be suppressed even when a thickness of a layer provided between electrodes of such light-emitting elements is changed. In addition, it is another object to provide light-emitting devices whose power consumption is reduced by including such light-emitting elements.

It is an object of one embodiment of the present invention to provide light-emitting elements in which an increase of driving voltage can be suppressed even when a thickness of a layer provided between electrodes of such light-emitting elements is changed, and of which optical adjustment can be conducted. In addition, it is another object to provide light-emitting devices whose power consumption is reduced and which can have excellent color purity by including such light-emitting elements.

It is an object of one embodiment of the present invention to suppress an increase of driving voltage for light-emitting elements each having a layer including an acceptor substance and a layer including a donor substance. In addition, it is another object to provide light-emitting devices whose power consumption is reduced by including such light-emitting elements.

It is an object of one embodiment of the present invention to provide light-emitting elements configured so that an acceptor substance in a layer including the acceptor substance and a donor substance in a layer including the donor substance hardly interact with each other and hardly interfere with their functions mutually. In addition, it is another object to provide light-emitting devices whose power consumption is reduced by including such light-emitting elements.

In addition, according to one embodiment of the present invention, in a light-emitting element having an EL layer between an anode and a cathode, a first layer in which carriers can be produced is formed between the cathode and the EL layer and in contact with the cathode, a second layer which transfers (donates and accepts) electrons produced in the first layer is formed in contact with the first layer, and a third layer which injects the electrons received from the second layer into the EL layer is formed in contact with the second layer.

Note that the first layer is formed so as to include a high hole-transporting substance and an acceptor substance, and holes of the carriers produced in the first layer move into the cathode while electrons move into the second layer.

In addition, as the substance included in the second layer, a high electron-transporting layer having a slightly higher LUMO level (preferably, −5.0 eV or higher, more preferably from −5.0 eV to −3.0 eV) than an acceptor level of an acceptor substance included in the first layer is used, so that electron transfer can be easily conducted from the first layer to the second layer.

In addition, the third layer is formed using a high electron-injecting substance such as an alkali metal, an alkaline earth metal, a rare earth metal, an alkali metal compound, an alkaline earth metal compound, or a rare earth metal compound, or a high electron-transporting substance including a donor substance, and thereby injection barrier in injection of electrons into the EL layer can be reduced.

One embodiment of the present invention is a light-emitting element including at least an EL layer between an anode and a cathode; a first layer including a high hole-transporting substance and an acceptor substance, provided in contact with the cathode between the cathode and the EL layer; a second layer including a high electron-transporting substance, provided in contact with the first layer; and a third layer including at least one selected from the group consisting of an alkali metal, an alkaline earth metal, a rare earth metal, an alkali metal compound, an alkaline earth metal compound, and a rare earth metal compound, provided in contact with the second layer and the EL layer.

In addition, in the above structure, the EL layer may include a fourth layer including a high electron-transporting substance, and the fourth layer is in contact with the third layer.

Another embodiment of the present invention is a light-emitting element including at least an EL layer between an anode and a cathode; a first layer including a high hole-transporting substance and an acceptor substance, provided in contact with the cathode between the cathode and the EL layer; a second layer including a high electron-transporting substance, provided in contact with the first layer; and a third layer including a donor substance and a high electron-transporting substance, provided in contact with the second layer and the EL layer.

In the above structure, the first layer includes the acceptor substance at a mass ratio of from 0.1 to 4.0 with respect to the high hole-transporting substance.

In the above structure, the first layer has a stacked structure of a layer including a high hole-transporting substance and a layer including an acceptor substance.

In the above structure, the third layer includes the donor substance at a mass ratio of from 0.001 to 0.1 with respect to the high electron-transporting substance.

In the above structure, the donor substance is an alkali metal, an alkaline earth metal, a rare earth metal, an alkali metal compound, an alkaline earth metal compound, or a rare earth metal compound.

In the above structure, the high electron-transporting substance included in the second layer has a LUMO level of −5.0 eV or higher.

In the above structure, the high electron-transporting substance included in the second layer is a perylene derivative or nitrogen-containing condensed aromatic compound.

In the above structure, the EL layer includes a fifth layer including a high hole-transporting substance and an acceptor substance, and the fifth layer is in contact with the anode.

In the above structure, the fifth layer includes the acceptor substance at a mass ratio of from 0.1 to 4.0 with respect to the high hole-transporting substance.

In the above structure, the fifth layer has a stacked structure of a layer including a high hole-transporting substance and a layer including an acceptor substance.

In the above structure, the acceptor substance included in the first layer is a transition metal oxide or an oxide of a metal belonging to Groups 4 to 8 in the periodic table.

In addition, in the above structure, the acceptor substance included in the first layer is molybdenum oxide.

Further, the present invention includes, in its category, electronic devices and lighting devices including light-emitting devices as well as light-emitting devices including light-emitting elements. Accordingly, the term "light-emitting device" in this specification refers to image display devices, light-emitting devices, or light sources (including lighting device). In addition, the light-emitting device includes all types modules: a module in which a light-emitting device is connected to a connector such as an FPC (Flexible Printed Circuit), a TAB (Tape Automated Bonding) tape or a TCP (Tape Carrier Package), a module in which a printed wiring board is provided on the tip of a TAB tape or a TCP, and a module in which an IC (Integrated Circuit) is directly mounted on a light-emitting element using a COG (Chip On Glass) technique.

As described above, one embodiment of the present invention can provide light-emitting elements in which an increase of driving voltage can be suppressed. Further, light-emitting devices, electronic devices and lighting devices with reduced power consumption can be provided by including such light-emitting elements.

In addition, even when the thickness of the first layer is changed, the driving voltage is not increased. Thus, even when the total thickness of layers provided between electrodes of a light-emitting element is changed, the light-emitting element with an increase of the driving voltage suppressed can be provided. Further, light-emitting devices with reduced power consumption can be provided by including such light-emitting elements.

In addition, even when the thickness of the first layer is made different, the driving voltage is not increased. Thus, even when the thickness of layers provided between electrodes of a light-emitting element is made different, the light-emitting element with suppressed rise of the driving voltage can be provided. Further, light-emitting devices with reduced power consumption and excellent color purity can be provided by including such light-emitting elements.

In addition, according to one embodiment of the present invention, the second layer is disposed between the first layer including an acceptor substance and a third layer including a high electron-injecting substance or a donor substance, and thus interaction between the acceptor substance and the high electron-injecting substance or interaction between the acceptor substance and the donor substance hardly occurs, whereby a light-emitting element in which interactive functional interference hardly occurs can be provided. In addition, a light-emitting device with reduced power consumption can be provided by including such a light-emitting element.

DETAILED DESCRIPTION OF THE INVENTION

Hereinafter, embodiments of the present invention will be described in detail with reference to the accompanying drawings. However, the present invention is not limited to description to be given below, and it is to be easily understood that modes and details thereof can be variously modified without departing from the spirit and the scope of the present invention.

Embodiment 1

Figure 1A:
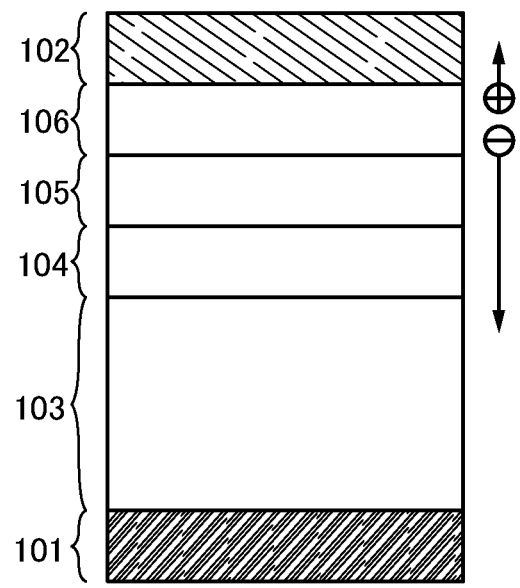
FIGS. 1A and 1B illustrate an element structure of a light-emitting element and a band diagram thereof respectively.
Figure 1B:
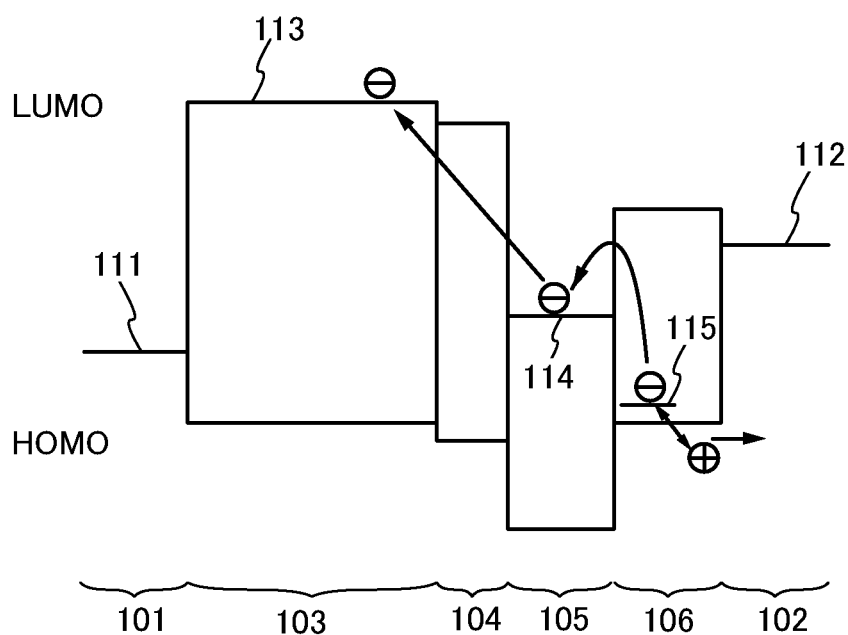

Embodiment 1 will describe an element structure of a light-emitting element according to one embodiment of the present invention with reference to FIGS. 1A and 1B.

In an element structure illustrated in FIG. 1A, an EL layer 103 including an emission region is disposed between a pair of electrodes (an anode 101 and a cathode 102), a charge production region 106 as a first layer which enables carrier production, an electron-relay layer 105 as a second layer which receives and passes on electrons produced in the charge production region 106, and an electron-injecting buffer 104 as a third layer which injects the electrons received from the electron-relay layer 105 into the EL layer 103 are sequentially stacked from the cathode 102 side between the cathode 102 and the EL layer 103.

In addition, in the charge production region 106, holes and electrons are produced as carriers of the light-emitting element, and the holes move into the cathode 102 and the electrons move into the electron-relay layer 105. Further, the electron-relay layer 105 has a high electron-transporting property, and thus can transport rapidly electrons into the electron-injecting buffer 104. Furthermore, because the electron-injecting buffer 104 can reduce injection barrier in injection of electrons into the EL layer 103, it can improve electron injection efficiency into the EL layer 103.

FIG. 1B is a band diagram of the element structure illustrated in FIG. 1A. In FIG. 1B, reference numeral 111 denotes a Fermi level of the anode 101; 112, a Fermi level of the cathode 102; 113, a LUMO (lowest unoccupied molecular orbital) level of the EL layer 103; 114, a LUMO level of the electron-relay layer 105; and 115, an acceptor level of an acceptor substance in the charge production region 106.

In addition, the electron-relay layer 105 functions as a layer for efficiently injecting electrons produced in the charge production region 106 into the EL layer 103, and thus the LUMO level of the electron-relay layer 105 is formed so as to have a level between the acceptor level of the acceptor substance in the charge production region 106 and the LUMO level of the EL layer 103. Specifically, the LUMO level of the electron-relay layer 105 is preferably about from −5.0 eV to −3.0 eV. In addition, the provision of the electron-relay layer 105 can prevent interaction between the charge production region 106 and the electron-injecting buffer 104.

Further, as illustrated in the band diagram of FIG. 1B, the electrons that have moved to the electron-relay layer 105 from the charge production region 106 are easily injected into the LUMO level 113 of the EL layer 103 because of reduced injection barrier due to the electron-injecting buffer 104. Note that the holes produced in the charge production region 106 move into the cathode 102.

Next, materials that can be used for the above-described light-emitting element are specifically described.

The anode 101 is preferably formed using a metal, an alloy, an electrically-conductive compound, a mixture of these materials, or the like, having a high work function (specifically, a work function of greater than or equal to 4.0 eV). Specifically, indium tin oxide (ITO), indium tin oxide containing silicon or silicon oxide, indium zinc oxide (IZO), indium oxide containing tungsten oxide and zinc oxide, and the like can be given, for example.

Films of these conductive metal oxides are usually formed by sputtering. Alternatively, the films may be formed by application of a sol-gel method or the like. For example, a film of indium oxide-zinc oxide (IZO) can be formed by a sputtering method using a target in which zinc oxide is added to indium oxide at 1 wt % to 20 wt %. A film of indium oxide containing tungsten oxide and zinc oxide can be formed by a sputtering method using a target in which tungsten oxide and zinc oxide are added to indium oxide at 0.5 wt % to 5 wt % and 0.1 wt % to 1 wt %, respectively.

Besides, as a material used for the anode 101, the following can be given: gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), molybdenum oxide, vanadium oxide, ruthenium oxide, tungsten oxide, manganese oxide, titanium oxide, and the like. Alternatively, a conductive polymer such as poly(3,4-ethylenedioxythiophene)/poly(styrenesulfonic acid) (PEDOT/PSS) or polyaniline/poly(styrenesulfonic acid) (PAni/PSS) may be used. Note that, in the case where a charge production region is provided in contact with the anode 101, a variety of conductive materials such as Al and Ag can be used for the anode 101 regardless of their work functions.

The cathode 102 can be formed using a metal, an alloy, an electrically-conductive compound, a mixture of these materials, or the like, having a low work function (specifically, a work function of less than or equal to 3.8 eV). As specific examples of such a cathode material, the following can be given: an element that belongs to Group 1 or 2 of the periodic table, that is, an alkali metal such as lithium (Li) or cesium (Cs), an alkaline earth metal such as magnesium (Mg), calcium (Ca), or strontium (Sr), an alloy containing these (such as an MgAg alloy or an AlLi alloy), a rare-earth metal such as europium (Eu) or ytterbium (Yb), an alloy containing these, and the like. Note that a film of an alkali metal, an alkaline earth metal, or an alloy thereof can be formed by a vacuum evaporation method. Alternatively, an alloy containing an alkali metal or an alkaline earth metal can be formed by a sputtering method. Further alternatively, a film can be formed using silver paste or the like by an ink-jet method or the like.

Alternatively, the cathode 102 can be formed using a stack of a thin film of an alkali metal compound, an alkaline earth metal compound, or a rare earth metal compound (e.g., lithium fluoride (LiF), lithium oxide (LiOx), cesium fluoride (CsF), calcium fluoride ($CaF_2$), or erbium fluoride ($ErF_3$)) and a film of a metal such as aluminum. However, in the case where the charge production region is provided in contact with the cathode 102 as in the structure of this embodiment, a variety of conductive materials such as Al, Ag, ITO, and indium oxide-tin oxide containing silicon or silicon oxide can be used for the cathode 102 regardless of their work functions.

Note that in the light-emitting element described in this embodiment, at least one of the anode and the cathode may have a property of transmitting visible light. The light-transmitting property can be ensured with use of a transparent electrode such as ITO, or reduction in the thickness of an electrode.

The EL layer 103 may include at least a light-emitting layer, and may also have a structure in which layers other than the light-emitting layer are stacked. As the layers other than the light-emitting layer, there are layers formed of a substance having a high hole-injecting property, a substance having a high hole-transporting property, a substance having a high electron-transporting property, a substance having a high electron-injecting property, a substance having a bipolar property (a substance having high electron-and-hole-transporting properties), and the like. Specifically, a hole-injecting layer, a hole-transporting layer, a light-emitting layer, a hole-blocking layer, an electron-transporting layer, an electron-injecting layer, and the like are given, and such layers can be combined as appropriate and stacked from the anode side. Furthermore, a charge production region can be provided in a portion of the EL layer 103, which is on the side where the EL layer 103 is in contact with the anode 101.

A material which is used for forming each of the layers included in the EL layer 103 is specifically described.

The hole-injecting layer is a layer containing a substance having a high hole-injecting property. As the substance having a high hole-injecting property, for example, molybdenum oxide, vanadium oxide, ruthenium oxide, tungsten oxide, manganese oxide, or the like can be used. Besides, a phthalocyanine-based compound such as phthalocyanine ($H_2Pc$) or copper phthalocyanine (CuPc), a high molecule such as poly(3,4-ethylenedioxythiophene)/poly(styrenesufonic acid) (PEDOT/PSS), or the like can also be used for forming the hole-injecting layer.

The hole-transporting layer is a layer containing a substance having a high hole-transporting property. As the substance having a high hole-transporting property, the following can be given, for example: aromatic amine compounds such as 4,4'-bis[N-(1-naphtyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2), 3-[N-(1-naphtyl)-N-(9-phenylcarbazol-3-yl)amino]-9-phenylcarbazole (abbreviation: PCzPCN1), and the like. Alternatively, the following carbazole derivative can be used: 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthryl)phenyl]-9H-carbazole (abbreviation: CzPA). The substances listed here are mainly substances having a hole mobility of greater than or equal to $10^{-6}$ $cm^2/Vs$. However, substances other than those can also be used as long as they have a hole-transporting property higher than an electron-transporting property. The layer containing a substance having a high hole-transporting property is not limited to a single layer, and may be a stack of two or more layers each containing the above-described substance.

In addition to the above substances, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: Poly-TPD) can be used for the hole-transporting layer.

The light-emitting layer is a layer including a light-emitting substance. As the light-emitting substance, the following fluorescent compound can be used, for example: N,N'-bis[4-(9H-carbazol-9-yOphenyl]-NA'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-antryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N'''-(2-tert-butylanthracene-9,10-diyldi-4,1-phenylene)bis[N,N',N'-triphenyl-1,4-phen ylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N', N'-triphenyl-1,4-phenylenediamine (abbreviation: 2DPAPPA), N,N,N',N',N'',N'',N''',N'''-octaphenyldibenzo[g, p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12- bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin9-yl)ethenyl]-4H-pyran-4-ylidene}propanedinitrile (abbreviation: DCM2), N,N,N',N'-tetrakis(4-methylphenyOtetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), and the like.

Alternatively, as the light-emitting substance, the following phosphorescent compound can be used, for example: bis[2-(4',6'-difluorophenyl)pyridinato-N, $C^{2'}$]iridium(III) tetrakis(1-pyrazolyl)borate (abbreviation: FIr6), bis[2-(4',6'-difluorophenyOpyridinato-N,$C^{2'}$]iridium(III)picolinate (abbreviation: FIrpic), bis[2-(3',5'-bistrifluoromethylphenyl)pyridinato-N, $C^{2'}$]iridium(III)picolinate (abbreviation: Ir(CF$_3$ppy)$_2$(pic)), bis[2-(4',6'-difluorophenyl)pyridinato-N, $C^{2'}$]iridium(III) acetylacetonate (abbreviation: FIracac), tris(2-phenylpyridinato-N, $C^{2'}$)iridium(III) (abbreviation: Ir(ppy)$_3$), bis(2-phenylpyridinato)iridium(III)acetylacetonato (abbreviation: Ir(ppy)$_2$(acac)), bis(benzo[h]quinolinato)iridium(III)acetylacetonate (abbreviation: Ir(bzq)$_2$(acac)), bis(2,4-diphenyl-1,3-oxazolato-N,$C^{2'}$)iridium(III) acetylacetonate (abbreviation: Ir(dpo)$_2$(acac)), bis[2-(4'-perfluorophenylphenyl)pyridinato]iridium(III) acetylacetonate (abbreviation: Ir(p-PF-ph)$_2$(acac)), bis(2-phenylbenzothiazolato-N,$C^{2'}$)iridium(III)acetylacetonate (abbreviation: Ir(bt)$_2$(acac)), bis[2-(2'-benzo[4,5-α]thienyl)pyridinato-N,$C^{3'}$]iridium(III) acetylacetonate (abbreviation: Ir(btp)$_2$(acac)), bis(1-phenylisoquinolinato-N,$C^{2'}$)iridium(III) acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), 2,3,7,8,12,13,17,18-octaethyl-21H,23H-porphyrin platinum(II) (abbreviation: PtOEP), tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), tris[1-(2-thenoyl)-3,3,3-trifluoroacetonato](monophenanthroline) europium(III) (abbreviation: Eu(TTA)$_3$(Phen)), and the like.

Note that those light-emitting substances are preferably dispersed in a host material. As the host material, for example, the following can be used: an aromatic amine compound such as NPB (abbreviation), TPD (abbreviation), TCTA (abbreviation), TDATA (abbreviation), MTDATA (abbreviation), or BSPB (abbreviation); a carbazole derivative such as PCzPCA1 (abbreviation), PCzPCA2 (abbreviation), PCzPCN1 (abbreviation), CBP (abbreviation), TCPB (abbreviation), or CzPA (abbreviation); a high hole-transporting substance which contains a high molecular compound, such as PVK (abbreviation), PVTPA (abbreviation), PTPDMA (abbreviation), or Poly-TPD (abbreviation); a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolate)aluminum (abbreviation: BAlq); a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)-benzothiazolato]zinc (abbreviation: Zn(BTZ)$_2$); or a substance having a high electron-transporting property, such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]carbazole (abbreviation: CO11), 3-(4-biphenylyl)-4-phenyl-5-(4-tert-butylphenyl)-1,2,4-triazole (abbreviation: TAZ), bathophenanthroline (abbreviation: BPhen), or bathocuproine (abbreviation: BCP).

The electron-transporting layer is a layer including a high electron-transporting substance. As the high hole-transporting substance, for example, a metal complex having a quinoline skeleton or a benzoquinoline skeleton, such as Alq (abbreviation), Almq$_3$ (abbreviation), BeBq$_2$ (abbreviation), or BAlq (abbreviation) can be used. In addition to the above, a metal complex having an oxazole-based or thiazole-based ligand, such as Zn(BOX)$_2$ (abbreviation) or Zn(BTZ)$_2$ (abbreviation) can also be used. Furthermore, in addition to the above metal complexes, PBD (abbreviation), OXD-7 (abbreviation), CO11 (abbreviation), TAZ (abbreviation), BPhen (abbreviation), BCP (abbreviation), or the like can also be used. The substances listed here are mainly substances having an electron mobility of $10^{-6}$ cm$^2$/Vs or higher. Note that substances other than those may be used as long as they have an electron-transporting property higher than a hole-transporting property. Furthermore, the electron-transporting layer may have a structure in which two or more layers formed of the above substances are stacked, without limitation to a single-layer structure.

In addition to the above substances, a high molecular compound such as PF-Py (abbreviation) or PF-BPy (abbreviation) can be used for the electron-transporting layer.

The electron-injecting layer is a layer including a high electron-injecting substance. As the high electron-injecting substance, the following can be given: an alkali metal or an alkaline earth metal such as lithium (Li), cesium (Cs), calcium (Ca), lithium fluoride (LiF), cesium fluoride (CsF), and calcium fluoride (CaF$_2$), and a compound thereof. Alternatively, a layer containing an electron-transporting substance and an alkali metal, an alkaline earth metal, or a compound thereof (e.g., Alq containing magnesium (Mg)) can be used. Such a structure makes it possible to increase the efficiency of injection of electrons from the cathode 102.

As described above, a charge production region which is provided in a portion of the EL layer 103 closer to the side which is in contact with the anode 101 is a region that contains a high hole-transporting substance and an acceptor substance. The charge production region may not only include a high hole-transporting substance and an acceptor substance in the same film but also includes a stacked layer of a layer containing a high hole-transporting substance and a layer containing an acceptor substance. However, in the case of the stacked-layer structure provided on the anode side, the layer containing an acceptor substance is in contact with the anode 101, while in the case of the stacked-layer structure provided on the cathode side, the layer containing a high hole-transporting substance is in contact with the cathode 102.

The charge production region is formed, whereby the anode 101 can be formed without consideration of a work function of a material for forming the anode 101. In other words, not only a material having a high work function but also a material having a low work function can be used as the material for forming the anode 101.

As the acceptor substance that is used for the charge production region, a transition metal oxide and an oxide of a metal belonging to Groups 4 to 8 of the periodic table can be given. Specifically, molybdenum oxide is particularly preferable. Note that molybdenum oxide has a low hygroscopic property.

As the high hole-transporting substance used for the charge production region, any of a variety of organic compounds such as an aromatic amine compound, a carbazole derivative, an aromatic hydrocarbon, and a high molecular compound (such as an oligomer, a dendrimer, or a polymer) can be used. Specifically, a substance having a hole mobility of $10^{-6}$ cm$^2$/Vs or higher is preferable. However, substances other than those can also be used as long as they have a hole-transporting property higher than an electron-transporting property.

Note that such layers are stacked in appropriate combination, whereby the EL layer 103 can be formed. Further, as a formation method of the EL layer 103, any of a variety of methods (e.g., a dry process and a wet process) can be selected as appropriate depending on a material to be used. For example, a vacuum evaporation method, an ink-jet method, a spin coating method, or the like can be used. Note that a different formation method may be employed for each layer.

Further, between the cathode 102 and the EL layer 103, the electron-injecting buffer 104, the electron-relay layer 105, and the charge production region 106 are provided. The charge production region 106 is formed in contact with the cathode 102, the electron-relay layer 105 is formed in contact with the charge production region 106, and the electron-injecting buffer 104 is formed in contact with and between the electron-relay layer 105 and the EL layer 103.

The charge production region 106 is a region that contains a high hole-transporting substance and an acceptor substance. Note that the charge production region 106 can be formed using a material similar to the above-described material used for the charge production region that can be formed in part of the EL layer 103 and can have a similar structure to the charge production region. Therefore, the charge production region 106 can not only contain a high hole-transporting substance and an acceptor substance in the same film but also include a stacked layer of a layer containing a high hole-transporting substance and a layer containing an acceptor substance. Note that in the case of the stacked layer, the layer containing a high hole-transporting substance is in contact with the cathode 102.

Note that the acceptor substance is preferably added to the charge production region 106 so that the mass ratio of the acceptor substance to the high hole-transporting substance is from 0.1 to 4.0:1.

The electron-relay layer 105 is a layer that can quickly receive electrons drawn out by the acceptor substance in the charge production region 106. Therefore, the electron-relay layer 105 is a layer that contains a high electron-transporting substance and is formed to have a LUMO level between the acceptor level of the acceptor in the charge production region 106 and the LUMO level of the EL layer 103. Specifically, the LUMO level is from −5.0 eV to −3.0 eV is preferable. As the substance used for the electron-relay layer 105, for example, a perylene derivative and a nitrogen-containing condensed aromatic compound can be given. Note that a nitrogen-containing condensed aromatic compound is preferably used for the electron-relay layer 105 because of its stability. Furthermore, of nitrogen-containing condensed aromatic compounds, a compound having an electron-withdrawing group such as a cyano group or a fluoro group is preferably used, in which case electrons are easily received in the electron-relay layer 105.

As specific examples of the perylene derivative, the following can be given: 3,4,9,10-perylenetetracarboxylic dianhydride (PTCDA), 3,4,9,10-perylenetetracarboxylic bisbenzimidazole (PTCBI), N,N'-dioctyl-3,4,9,10-perylenetetracarboxylic diimide (PTCDI-C8H), N,N'-dihexyl-3,4, 9,10-perylenetetracarboxylic diimide (Hex PTC), and the like.

As specific examples of the nitrogen-containing condensed aromatic compound, the following can be given: pirazino[2,3-f][1,10]phenanthroline-2,3-dicarbonitrile (PPDN), 2,3,6,7,10,11-hexacyano-1,4,5,8,9,12-hexaazatriphenylene (HAT(CN)$_6$), 2,3-diphenylpyrido[2,3-b]pyrazine (2PYPR), 2,3-bis(4-fluorophenyl)pyrido[2,3-b]pyrazine (F2PYPR), and the like.

Besides, 7,7,8,8-tetracyanoquinodimethane (TCNQ), 1,4, 5,8-naphthalenetetracarboxylicdianhydride (NTCDA), perfluoropentacene, copper hexadecafluoro phthalocyanine (F$_{16}$CuPc), N,N'-bis(2,2,3,3,4,4,5,5,6,6,7,7,8,8,8-pentadecafluorooctyl-1,4,5,8-naphthalenetetracarboxylic diimide (NTCDI-C8F), 3',4'-dibutyl-5,5''-bis(dicyanomethylene)-5, 5''-dihydro-2,2':5',2''-terthiophen) (DCMT), methanofullerene, such as [6,6]-phenyl C$_{61}$ butyric acid methyl ester (PCBM), or the like can be used for the electron-relay layer 105.

The electron-injecting buffer 104 is a layer that can inject the electrons received by the electron-relay layer 105 into the EL layer 103. The provision of the electron-injecting buffer 104 makes it possible to reduce the injection barrier between the charge production region 106 and the EL layer 103; thus, the electrons produced in the charge production region 106 can be easily injected into the EL layer 103.

A high electron-injecting substance can be used for the electron-injecting buffer 104: for example, an alkali metal, an alkaline earth metal, a rare earth metal, a compound of the above metal (including an alkali metal compound (an oxide such as lithium oxide or the like, a halide, and carbonate such as lithium carbonate or cesium carbonate), an alkaline earth metal compound (including an oxide, a halide, and carbonate), and a rare earth metal compound (including an oxide, a halide, and carbonate).

Further, in the case where the electron-injecting buffer 104 contains a high electron-transporting substance and a donor substance, the donor substance is preferably added so that the mass ratio of the donor substance to the electron-transporting substance is from 0.001 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (including an oxide of lithium oxide or the like, a halide, and carbonate such as lithium carbonate or cesium carbonate), an alkaline earth metal compound (including an oxide, a halide, and carbonate), and a rare earth metal compound (including an oxide, a halide, and carbonate). Note that as the high electron-transporting substance, a material similar to the above-described material for the electron-transporting layer that can be formed in part of the EL layer 103 can be used.

The light-emitting element described in this embodiment can be fabricated by combination of the above-described materials. Although light emission from the above-described light-emitting substance can be obtained with this light-emitting element, a variety of emission colors can be obtained by changing the type of the light-emitting substance. In addition, a plurality of light-emitting substances of different colors are used as the light-emitting substance, whereby light emission having a broad spectrum or white light emission can also be obtained. Note that in the case of white light emission, plural layers which emit light whose colors are complementary colors can be stacked. Specific examples of complementary colors include "blue and yellow", "blue-green and red", and the like.

Further, the light-emitting element described in this embodiment can be formed over any of a variety of substrates. As the substrate, for example, a substrate made of glass, plastic, a metal plate, metal foil, or the like can be used. In the case where light emission of the light-emitting element is extracted from the substrate side, a substrate having a light-transmitting property may be used. Note that as the substrate, a substrate other than the above may be used as long as it can serve as a support in the fabrication process of the light-emitting element.

Note that a passive matrix light-emitting device in which both electrodes are formed in a grid pattern over the same substrate can be manufactured with the structure of the light-emitting element described in this embodiment. In addition, an active matrix light-emitting device including a light-emitting element which is electrically connected to a thin film transistor (TFT) functioning as a switch, or the like and the driving of which is controlled by the TFT can also be manufactured with the structure of the light-emitting element described in this embodiment. Note that the structure of the TFT is not particularly limited. A staggered TFT or an inverted staggered TFT may be employed. In addition, a driver circuit formed with a TFT may be formed using an n-type TFT and a p-type TFT, or using either an n-type TFT or a p-type TFT. Crystallinity of a semiconductor film used for the TFT is not particularly limited, either. An amorphous semiconductor film may be used, or a crystalline semiconductor film may be used. Alternatively, a single crystal semiconductor film may be used. The single crystal semiconductor film can be formed by a Smart Cut (registered trademark) method or the like. Further alternatively, an oxide semiconductor, for example, an oxide semiconductor containing indium, gallium, and zinc can be used.

Further, the light-emitting element described in this embodiment can be formed by any of a variety of methods regardless of whether it is a dry process (e.g., a vacuum evaporation method) or a wet process (e.g., an ink-jet method or a spin coating method).

The element structure described in this embodiment is employed, whereby the driving voltage of the light-emitting element can be less likely to be adversely affected by the thickness of the charge production region 106. Thus, an increase in the driving voltage of the light-emitting element can be suppressed, and improvement of color purity by optical adjustment can be realized.

In addition, when the element structure described in this embodiment is employed, the electron-relay layer 105 is disposed between the charge production region 106 and the electron-injecting buffer 104, in which case a structure can be obtained in which the acceptor substance contained in the charge production region 106 and the donor substance contained in the electron-injecting buffer 104 are less likely to interact with each other, and thus hardly interfere with their functions.

Embodiment 2

In Embodiment 2, an example of the light-emitting element included in the basic structure described in Embodiment 1 will be described with reference to FIGS. 2A and 2B.

Figure 2A:
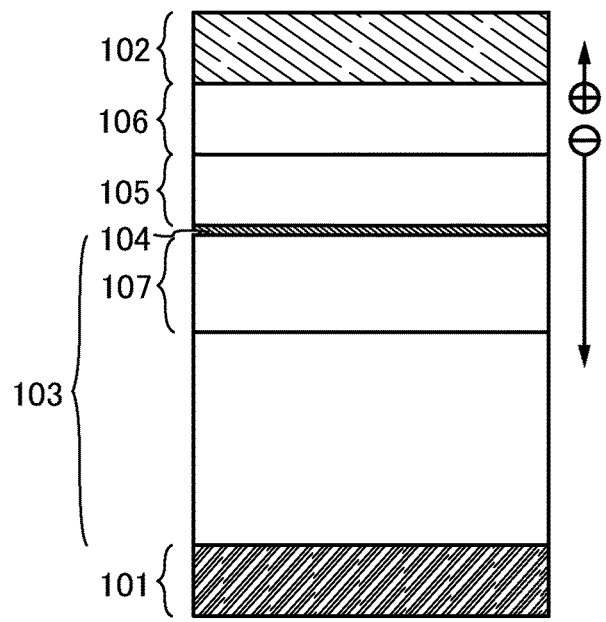
FIGS. 2A and 2B illustrate an element structure of a light-emitting element and a band diagram thereof respectively.

As illustrated in FIG. 2A, in a light-emitting element described in this embodiment, the EL layer 103 including a light-emitting region is disposed between a pair of electrodes (the anode 101 and the cathode 102), and between the EL layer 103 and the cathode 102, the charge production region 106, the electron-relay layer 105 and the electron-injecting buffer 104 are stacked in this order from the cathode 102 side.

The anode 101, the cathode 102, the EL layer 103, the charge production region 106, and the electron-relay layer 105 in Embodiment 2 can be formed using materials similar to those described in Embodiment 1.

In addition, as a substance used for the electron-injecting buffer 104, the following can be given: substances having a high electron-injecting property, such as alkali metals such as lithium (Li) and cesium (Cs); alkaline earth metals such as magnesium (Mg), calcium (Ca), and strontium (Sr); rare earth metals such as europium (Eu) and ytterbium (Yb); alkali metal compounds (including an oxide of lithium oxide and the like, a halide, and carbonate such as lithium carbonate and cesium carbonate); alkaline earth metal compounds (including an oxide, a halide, and carbonate), and rare earth metal compounds (including an oxide, a halide, and carbonate); and the like.

In the light-emitting element described in this embodiment, the EL layer 103 is formed over the anode 101, then, the electron-injecting buffer 104, the electron-relay layer 105, and the charge production region 106 are sequentially formed. The electron-injecting buffer 104 is formed to a very small thickness (specifically, 1 nm or smaller) so that an increase in the driving voltage is prevented. Thus, the electron-injecting buffer 104 is proximately located at the interface between the electron-relay layer 105 and the electron-transporting layer 107, which is a part of the EL layer 103. However, in a case where the electron-injecting buffer 104 is formed over the electron-transporting layer 107 after the electron-transporting layer 107 is formed, part of the substance used for forming the electron-injecting buffer 104 can also exist in the electron-transporting layer 107 that is a part of the EL layer 103.

Figure 2B:
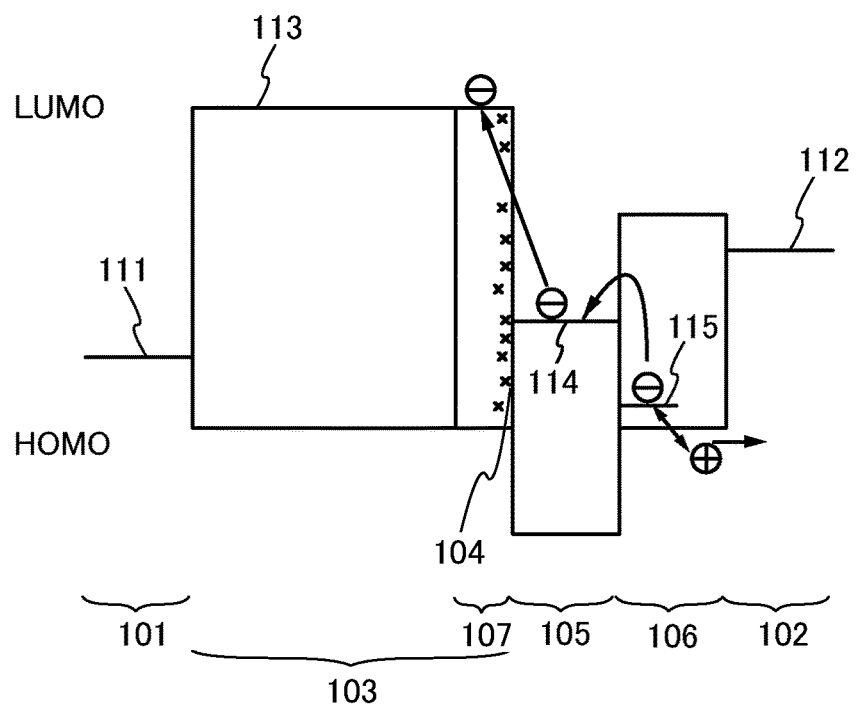

FIG. 2B is a band diagram of the element structure of FIG. 2A from the anode 101 side. In other words, the electron-injecting buffer 104 is provided at the interface between the electron-relay layer 105 and the EL layer 103, whereby the injection barrier between the charge production region 106 and the EL layer 103 can be reduced; thus, electrons produced in the charge production region 106 can be easily injected into the EL layer 103. In addition, holes produced in the charge production region 106 move into the cathode.

The structure of the electron-injecting buffer described in this embodiment is employed, whereby the driving voltage of the light-emitting element can be reduced in comparison with a structure of an electron-injecting buffer described in Embodiment 3 (that is formed by addition of a donor substance to a high electron-transporting substance).

In this embodiment, among the above-described high electron-injecting substances used for the electron-injecting buffer 104, an alkali metal compound (including an oxide such as lithium oxide, a halide, and carbonate such as lithium carbonate or cesium carbonate), an alkaline earth metal compound (including an oxide, a halide, and carbonate), a rare earth metal compound (including an oxide, a halide, and carbonate), are the like are stable in air. Thus, the light-emitting element of this embodiment using such a substance is suitable for mass production.

Note that the structure described in Embodiment 2 can be combined with the structure in Embodiment 1 as appropriate.

Embodiment 3

In Embodiment 3, an example of the light-emitting element included in the basic structure described in Embodiment 1 will be described with reference to FIGS. 3A and 3B.

Figure 3A:
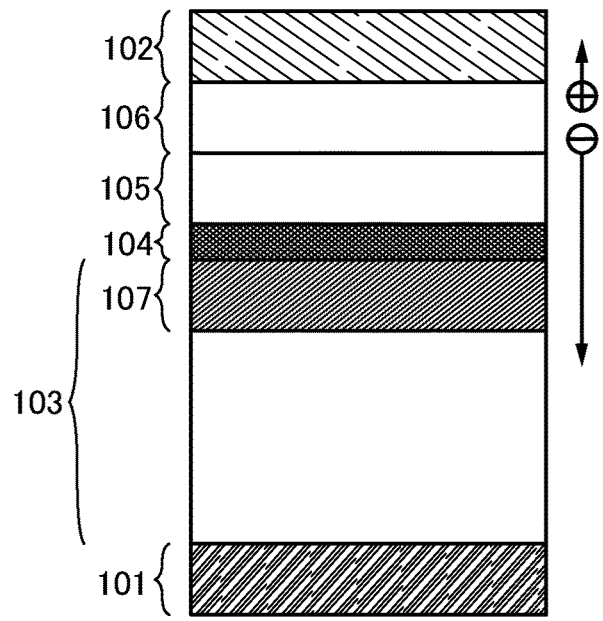
FIGS. 3A and 3B illustrate an element structure of a light-emitting element and a band diagram thereof respectively.
Figure 3B:
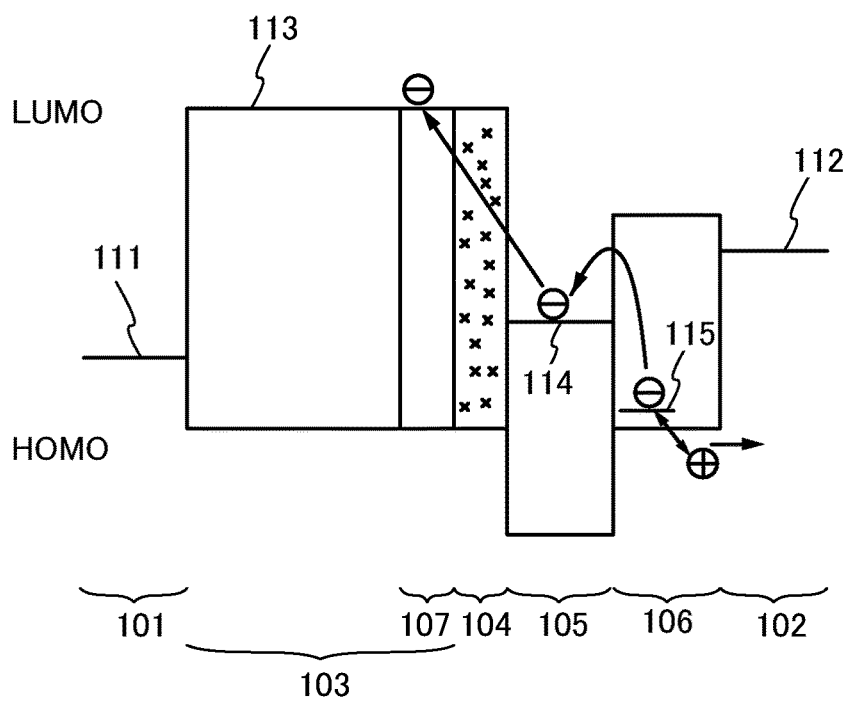

As illustrated in FIG. 3A, in a light-emitting element described in this embodiment, the EL layer 103 including a light-emitting region is disposed between a pair of electrodes (the anode 101 and the cathode 102), and between the EL layer 103 and the cathode 102, the charge production region 106, the electron-relay layer 105, and the electron-injecting buffer 104 are stacked sequentially from the cathode 102 side. In addition, the electron-injecting buffer 104 contains a high electron-transporting substance and a donor substance.

Note that, in this embodiment, the donor substance is preferably added so that the mass ratio of the donor substance to the high electron-transporting substance is from 0.001 to 0.1:1. Accordingly, the electron-injecting buffer 104 can function as electron-injecting buffer.

The anode 101, the cathode 102, the EL layer 103, the charge production region 106, and the electron-relay layer 105 in Embodiment 3 can be formed using materials similar to those described in Embodiment 1.

In addition, as the high electron-transporting substance used for the electron-injecting buffer 104, the following can be used, for example: a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq), or the like. Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)-benzothiazolato]zinc (abbreviation: Zn(BTZ)$_2$) can be used. Further alternatively, besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]carbazole (abbreviation: CO11), 3-(4-biphenylyl)-4-phenyl-5-(4-tert-biphenylyl)-1,2,4-triazole (abbreviation: TAZ), bathophenanthroline (abbreviation: BPhen), bathocuproine (abbreviation: BCP), or the like can be used. The substances described here are mainly substances having an electron mobility of $10^{-6}$ cm$^2$/Vs or higher.

Besides the above-described substances, a high molecular compound such as poly[(9,9-dihexylfluorene-2,7-diyl)-co-(pyridine-3,5-diyl)] (abbreviation: PF-Py) and poly[(9,9-dioctylfluorene-2,7-diyl)-co-(2,2'-bipyridine-6,6'-diyl)] (abbreviation: PF-BPy) can be used.

Further, as the donor substance used for the electron-injecting buffer 104, an alkali metal, an alkaline earth metal, a rare earth metal, a compound thereof (including an alkali metal compound (including an oxide such as lithium oxide, a halide, and carbonate such as lithium carbonate or cesium carbonate), an alkaline earth metal compound (including an oxide, a halide, and carbonate), a rare earth metal compound (including an oxide, a halide, and carbonate)), or the like can be used. Furthermore, an organic compound such as tetrathianaphthacene (abbreviation: TTN), nickelocene, or decamethylnickelocene can be used.

Note that, in this embodiment, the high electron-transporting substance used for the electron-injecting buffer 104 and a high electron-transporting substance used for the electron-transporting layer 107 that is a part of the EL layer 103 may be the same or different.

As illustrated in FIG. 3A, the light-emitting element described in this embodiment has a feature in that the electron-injecting buffer 104 containing the high electron-transporting substance and the donor substance is formed between the EL layer 103 and the electron-relay layer 105. FIG. 3B is a band diagram of this element structure.

In other words, the electron-injecting buffer 104 is formed, whereby the injection barrier between the electron-relay layer 105 and the EL layer 103 can be reduced; thus, electrons produced in the charge production region 106 can be easily injected into the EL layer 103. In addition, holes produced in the charge production region 106 move to the cathode.

Note that the structure described in Embodiment 3 can be combined with the structure described in Embodiment 1 or 2 as appropriate.

Embodiment 4

In Embodiment 4, as an example of the light-emitting element included in the basic structure described in Embodiment 1, the structure of the charge production region 106 will be described with reference to FIGS. 4A and 4B.

Figure 4A:
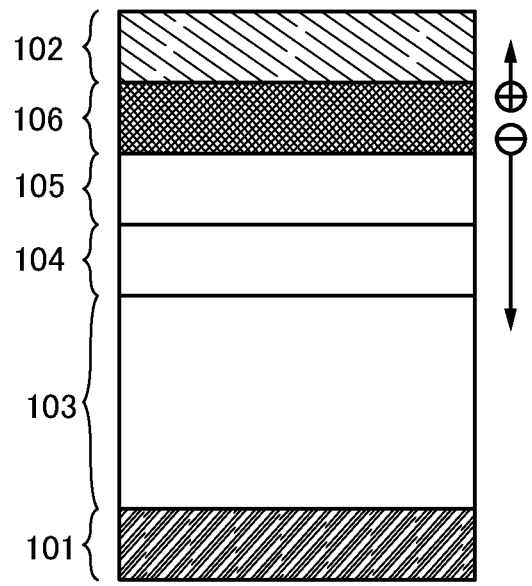
FIGS. 4A and 4B illustrate element structures of light-emitting elements.
Figure 4B:
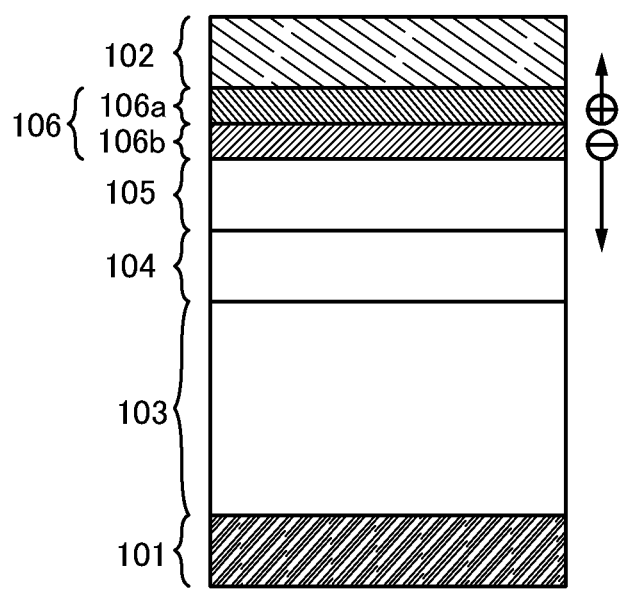

In element structures illustrated in FIGS. 4A and 4B, the EL layer 103 including a light-emitting region is disposed between a pair of electrodes (the anode 101 and the cathode 102), and between the EL layer 103 and the cathode 102, the charge production region 106, the electron-relay layer 105, and the electron-injecting buffer 104 are stacked sequentially from the cathode 102 side. In addition, the anode 101, the cathode 102, the EL layer 103, the electron-relay layer 105, and the electron-injecting buffer 104 can be formed using materials similar to those described in Embodiment 1.

In the element structures illustrated in FIGS. 4A and 4B, the charge production region 106 is a region that contains a high hole-transporting substance and an acceptor substance. Note that in the charge production region 106, electrons are extracted from the high hole-transporting substance by the acceptor substance, whereby holes and electrons are produced.

The charge production region 106 illustrated in FIG. 4A has a structure in which a high hole-transporting substance and an acceptor substance are contained in the same film. In that case, the acceptor substance is preferably added so that the mass ratio of the acceptor substance to the high hole-transporting substance is from 0.1 to 4.0:1, in which case carriers are easily produced in the charge production region 106.

On the other hand, the charge production region 106 illustrated in FIG. 4B has a structure in which a layer including a high hole-transporting substance 106a and a layer including an acceptor substance 106b are stacked. A charge transfer complex produced in the charge production region 106 is a substance which absorbs light in visible region. However, in the stacked structure in which the layer including a high hole-transporting substance 106a and the layer including an acceptor substance 106b are stacked, the charge transfer complex is formed at the interface between the layer 106a and the layer 106b, not in the whole charge production region 106. In other words, when the charge production region 106 has such a stacked structure, light emission in the light-emitting element is hardly subjected to influence of the charge transfer complex, which is preferable.

As the high hole-transporting substance used for the charge production region 106, any of a variety of organic compounds such as an aromatic amine compound, a carbazole derivative, aromatic hydrocarbon, and a high molecular compound (such as an oligomer, a dendrimer, and a polymer) can be used. Specifically, a substance having a hole mobility of $10^{-6}$ cm$^2$/Vs or higher is preferable. However, substances other than those can also be used as long as they have a hole-transporting property higher than an electron-transporting property.

As specific examples of the aromatic amine compound, the following can be given: 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4"-tris(carbazol-9-yl)triphenylamine (abbreviation: TCTA) 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), N,N'-bis(4-methylphenyl)-N,N'-diphenyl-p-phenylenediamine (abbreviation: DTDPPA), 4,4'-bis[N-(4-diphenylaminophenyl)-N-phenylamino]biphenyl (abbreviation: DPAB), 4,4'-bis[N-(3-methylphenyl)-N-phenylamino]biphenyl (abbreviation: DNTPD), 1,3,5-tris[N-(4-diphenylaminophenyl)-N-phenylamino]benzene (abbreviation: DPA3B), and the like.

As specific examples of the carbazole derivative, the following can be given: 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like. Besides, the following can be given: 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

As specific examples of the aromatic hydrocarbon, the following can be given: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA); 9,10-diphenylanthracene (abbreviation: DPAnth), 2-tert-butylanthracene (abbreviation: t-BuAnth); 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. In addition to those, pentacene, coronene, or the like can also be used. In this way, the aromatic hydrocarbon having a hole mobility of $1 \times 10^{-6}$ cm$^2$/Vs or higher and 14 to 42 carbon atoms is more preferably used.

Further, the aromatic hydrocarbon may have a vinyl skeleton. As the aromatic hydrocarbon having a vinyl group, for example, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like can be given.

Moreover, a high molecular compound such as poly(N-vinylcarbazole) (abbreviation: PVK) or poly(4-vinyltriphenylamine) (abbreviation: PVTPA) can also be used.

As the acceptor substance used for the charge production region 106, 7,7,8,8-tetracyano-2,3,5,6-tetrafluoroquinodimethane (abbreviation: F$_4$-TCNQ), chloranil, and the like can be given. In addition, a transition metal oxide can be given. Moreover, an oxide of a metal belonging to any of Groups 4 to 8 of the periodic table can be given. Specifically, vanadium oxide, niobium oxide, tantalum oxide, chromium oxide, molybdenum oxide, tungsten oxide, manganese oxide, and rhenium oxide are preferable because of their high electron accepting properties.

Note that the structure described in Embodiment 4 can be combined with any of the structures described in Embodiments 1 to 3 as appropriate.

Embodiment 5

Figure 5A:
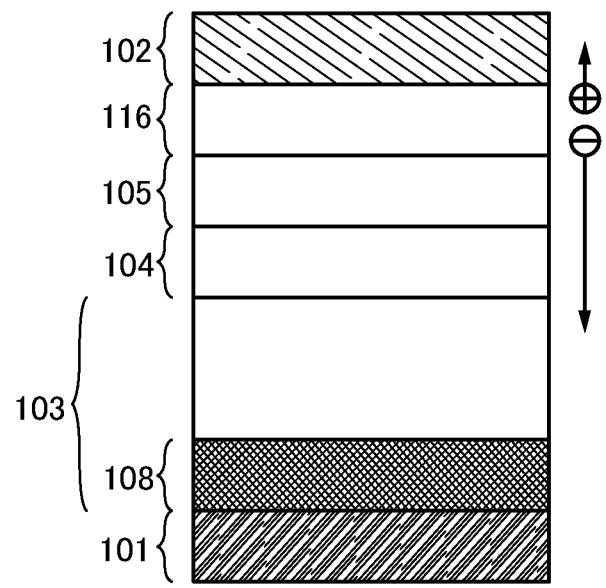
FIGS. 5A and 5B illustrate element structures of light-emitting elements.
Figure 5B:
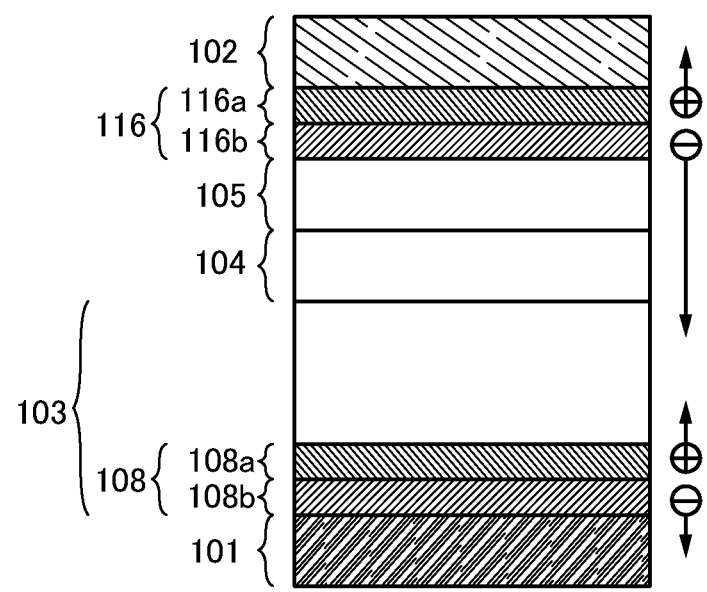

Embodiment 5 will describe a structure in which a first charge production region is formed in a part of the EL layer 103, so as to be in contact with the anode 101 with reference to FIGS. 5A and 5B, as an example of the light-emitting element included in the basic structure described in Embodiment 1. Thus, in this embodiment, the charge production region which is a part of the EL layer 103 and formed in contact with the anode 101 in this embodiment is referred to as a first charge production region 108, and the charge production region 106 described in Embodiment 1 is referred to as a second charge production region 116.

In FIGS. 5A and 5B, the EL layer 103 including a light-emitting region is disposed between a pair of electrodes (the anode 101 and a cathode 102), and the first charge production region 108 which is formed in a part of the EL layer 103 so as to be in contact with the anode 101 is provided. In addition, the second charge production region 116, the electron-relay layer 105 and the electron-injecting buffer 104 are sequentially stacked from the cathode 102 side between the cathode 102 and the EL layer 103. Note that the materials described in Embodiments 1 to 4 can be used for the anode 101, the cathode 102, the EL layer 103, the electron-injecting buffer 104, and the electron-relay layer 105, and the materials which are described in Embodiments 1 to 4 as the materials for the charge production region 106 can be used for the second charge production region 116.

In the light-emitting element illustrated in FIGS. 5A and 5B, the first charge production region 108 is similar to the second charge production region 116, and includes a high hole-transporting substance and an acceptor substance. Thus, in the first charge production region 108, electrons are extracted from the high hole-transporting substance by the acceptor substance, whereby holes and electrons are produced.

The first charge production region 108 illustrated in FIG. 5A has a structure in which a high hole-transporting substance and an acceptor substance are included in one film. In this case, preferably, the acceptor substance is added to the first charge production region 108 so that a mass ratio of the acceptor substance to the high hole-transporting substance is from 0.1 to 4.0:1, whereby production of carriers in the first charge production region 108 is facilitated. In addition, in FIG. 5A, the first charge production region 108 and the second charge production region 116 are formed using the same material, and thereby stresses on the anode 101 side and the cathode 102 side of the light-emitting element can be even, which leads to release of external stress.

On the other hand, the first charge production region 108 illustrated in FIG. 5B has a structure in which a layer including a high hole-transporting substance 108a and a layer including an acceptor substance 108b are stacked. Note that a charge transfer complex produced in the first charge production region 108 is a substance which absorbs light in visible region, but in a case where the layer including a high hole-transporting substance 108a and the layer including the acceptor substance 108b are stacked, the charge transfer complex exists not in the whole of the first charge production region 108 but at the interface between the layer including the high hole-transporting substance 108a and the layer including the acceptor substance 108b. In other words, when the first charge production region 108 has a stacked structure, light emission in the light-emitting element is hardly influenced by the charge transfer complex, which is preferable. In addition, as illustrated in FIG. 5B, the structure of the second charge production region 116 may be a structure in which a layer including a high hole-transporting substance 116a and a layer including an acceptor substance 116b are stacked.

Note that as the high hole-transporting substance used for formation of the first charge production region 108, the substances described as the high hole-transporting substance used for the formation of the charge production region 106 in Embodiment 4 can be used similarly. In addition, as the acceptor substance used for formation of the first charge production region 108, the substances described as the acceptor substance used for formation of the charge production region 106 in Embodiment 4 can be used similarly.

Note that the structure shown in Embodiment 5 can be combined with any of the structures described in Embodiments 1 to 4 as appropriate.

Embodiment 6

Embodiment 6 will describe a passive matrix light-emitting device and an active matrix light-emitting device as examples of light-emitting devices manufactured using such a light-emitting element described in any of Embodiments 1 to 5.

FIGS. 6A to 6D and FIG. 7 illustrate examples of passive matrix light-emitting devices.

In a passive-matrix (also referred to as "simple-matrix") light-emitting device, a plurality of anodes aligned in stripes (in stripe form) are provided to be perpendicular to a plurality of cathodes aligned in stripes, and a light-emitting layer is disposed at each intersection portion between the anode and the cathode. Therefore, a pixel at an intersection of an anode selected (to which a voltage is applied) and a cathode selected emits light.

Figure 6A:
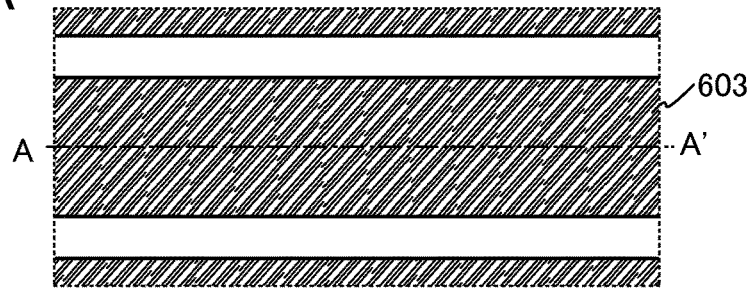
FIGS. 6A to 6D illustrate a passive matrix light-emitting device.
Figure 6B:
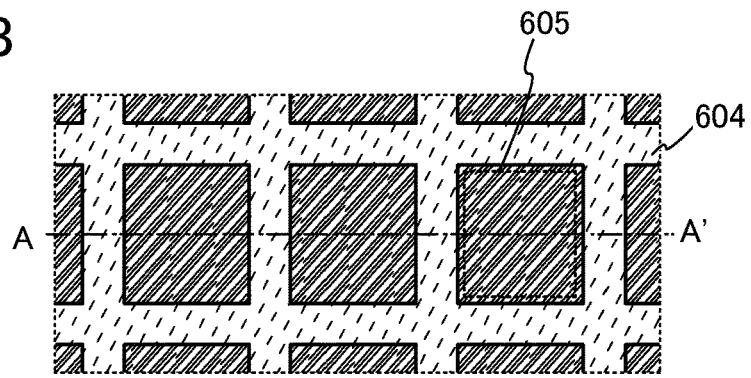
Figure 6C:
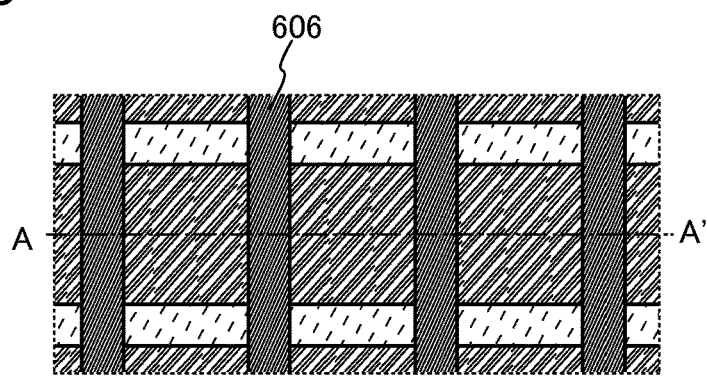
Figure 6D:
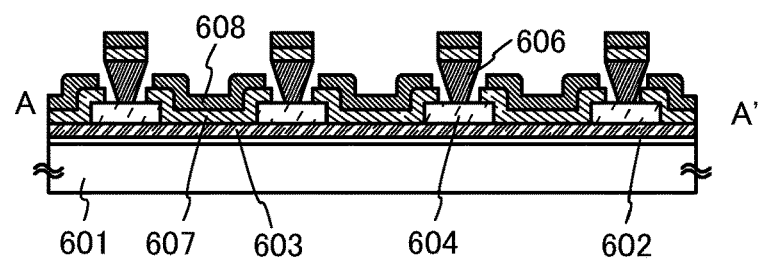

FIGS. 6A to 6C are top views of a pixel portion before sealing. FIG. 6D is a cross-sectional view taken along a chain line A-A' in FIGS. 6A to 6C.

Over a substrate 601, an insulating layer 602 is formed as a base insulating layer. Note that the insulating layer is not necessarily formed if not needed. Over the insulating layer 602, a plurality of first electrodes 603 are disposed in stripe form with equal spacing therebetween (FIG. 6A).

A partition 604 having openings corresponding to respective pixels is provided over the first electrodes 603. The partition 604 having openings is formed of an insulating material (a photosensitive or non-photosensitive organic material (e.g., polyimide, acrylic, polyamide, polyimideamide, resist, or benzocyclobutene) or an SOG film (e.g., a $SiO_x$ film containing an alkyl group)). Note that an opening 605 corresponding to each pixel serves as a light-emitting region (FIG. 6B).

Over the partition 604 having openings, a plurality of parallel inversely tapered partitions 606 are provided to intersect with the first electrodes 603 (FIG. 6C). The inversely tapered partitions 606 are formed as follows. By a photolithography method, a positive-type photosensitive resin of which portion unexposed to light remains as a pattern is used, and the amount of light exposure or the length of development time is adjusted so that a lower portion of the pattern is etched more.

After formation of the inversely tapered partitions 606 as illustrated in FIG. 6C, a layer including an organic compound 607 and a second electrode 608 are sequentially formed as illustrated in FIG. 6D. Note that the layer including an organic compound 607 in this embodiment indicates the layer including an EL layer, a charge production region (including the first charge production region and the second charge production region), an electron-relay layer, and an electron-injecting buffer, described as the layer formed between the anode and the cathode in Embodiments 1 to 5. The total height of the partition 604 having openings and the inversely tapered partition 606 is designed to be larger than the total thickness of the layer including an organic compound 607 and the second electrode 608, and thus, as illustrated in FIG. 6D, divided plural regions each including the layers including an organic compound 607 and second electrodes 608 are formed. Note that the plurality of divided regions are electrically isolated from one another.

The second electrodes 608 are electrodes in stripe form which are parallel to each other and extend in the direction intersecting with the first electrodes 603. Note that the layer including an organic compound 607 and part of a conductive layer forming the second electrode 608 are also formed over the inversely tapered partitions 606; however, they are separated from the layer including an organic compound 607 and the second electrodes 608. Note that the layer including an organic compound in this embodiment includes the charge production region (including the first charge production region and the second charge production region), the electron-relay layer, the electron-injecting buffer, and the EL layer described in Embodiments 1 to 5, and the EL layer includes at least a light-emitting layer.

Note that there is no particular limitation on the first electrode 603 and the second electrode 608, and it is acceptable that one of the first electrode 603 and the second electrode 608 in this embodiment may be an anode, and the other may be cathode. In addition, the stack structure of the layer including an organic compound 607 may be adjusted as appropriate depending on the polarities of electrodes so as to have the structure as described in Embodiments 1 to 5.

In addition, if necessary, a sealing material such as a sealing can or a glass substrate may be attached to the substrate 601 by an adhesive agent for sealing so that the light-emitting element can be disposed in the sealed space. Thereby, deterioration of the light-emitting element can be prevented. The sealed space may be filled with filler or a dry inert gas. Further, a desiccant or the like may be put between the substrate and the sealing material to prevent deterioration of the light-emitting element due to moisture. The desiccant removes a minute amount of moisture, thereby achieving sufficient desiccation. The desiccant may be a substance which absorbs moisture by chemical adsorption such as an oxide of an alkaline earth metal as typified by calcium oxide or barium oxide. Additionally, a substance which adsorbs moisture by physical adsorption such as zeolite or silica gel may be used as well, as a desiccant.

Figure 7:
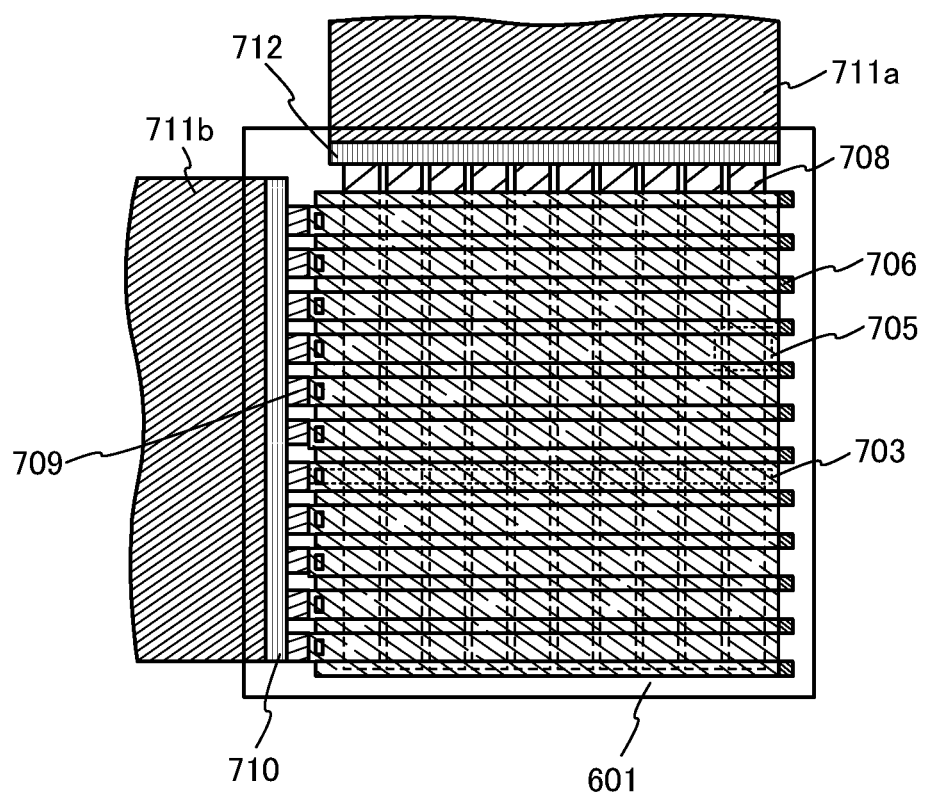
FIG. 7 illustrates a passive matrix light-emitting device.

Next, FIG. 7 shows a top view when the passive-matrix light-emitting device in FIGS. 6A to 6D is mounted with an FPC or the like.

As illustrated in FIG. 7, in a pixel portion forming an image display, a group of scan lines and a group of data lines intersect with each other so as to be perpendicular.

The first electrode 603 in FIGS. 6A to 6D corresponds to a scan line 703 in FIG. 7, and the second electrode 608 in FIGS. 6A to 6D corresponds to a data line 708 in FIG. 7, and the inversely tapered partition 606 in FIGS. 6A to 6D corresponds to a partition 706 in FIG. 7. The layers including an organic compound 607 in FIGS. 6A to 6D are disposed between the data lines 708 and the scan lines 703, and an intersection portion indicated by a region 705 corresponds to one pixel.

It is to be noted that the scan lines 703 are electrically connected at their ends to connection wirings 709 and the connection wirings 709 are connected to an FPC 711b through an input terminal 710. In addition, the data line 708 is connected to an FPC 711a via an input terminal 712.

If necessary, a polarizing plate, a circularly polarizing plate (including an elliptically polarizing plate), a retardation plate (a quarter-wave plate or a half-wave plate), or an optical film such as a color filter may be appropriately provided for an emission surface of light emitted from the light-emitting layer. Further, the polarizing plate or the circularly polarizing plate may be provided with an anti-reflection film. For example, anti-glare treatment may be done, by which reflected light can be diffused by projections and depressions on the surface so as to reduce the glare.

Although FIG. 7 illustrates the example in which a driver circuit is not provided over the substrate, an IC chip including a driver circuit may be mounted on the substrate.

When the IC chip is mounted, a data line side IC and a scan line side IC, in each of which a driver circuit for transmitting a signal to a pixel portion is formed, are mounted on the periphery of the pixel portion (outside the pixel portion) by a COG method. The mounting may be performed using TCP or a wire bonding method other than the COG method. TCP is a TAB tape mounted with an IC, and a TAB tape is connected to a wiring over an element formation substrate so that an IC is mounted. Each of the data line side IC and the scan line side IC may be formed using a silicon substrate. Alternatively, it may be formed in such a manner that a driver circuit is formed using a TFT over a glass substrate, a quartz substrate, or a plastic substrate.

Figure 8A:
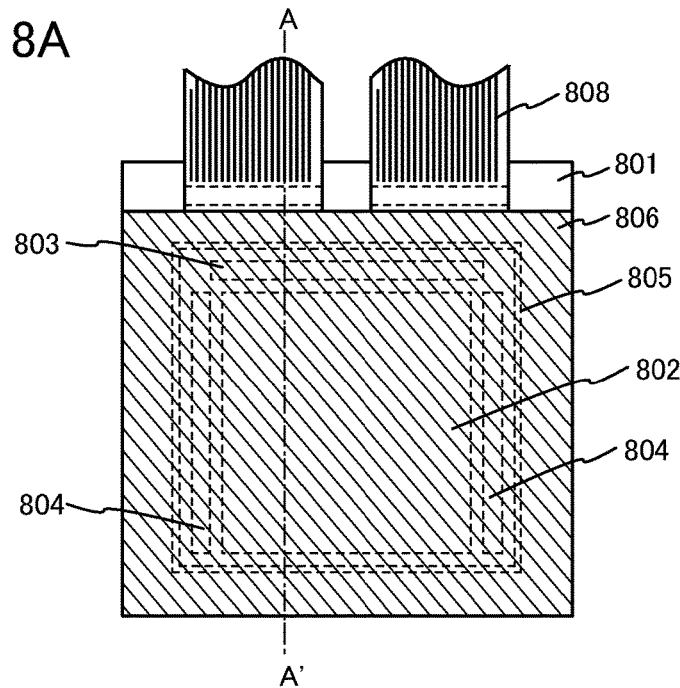
FIGS. 8A and 8B illustrate an active matrix light-emitting device.
Figure 8B:
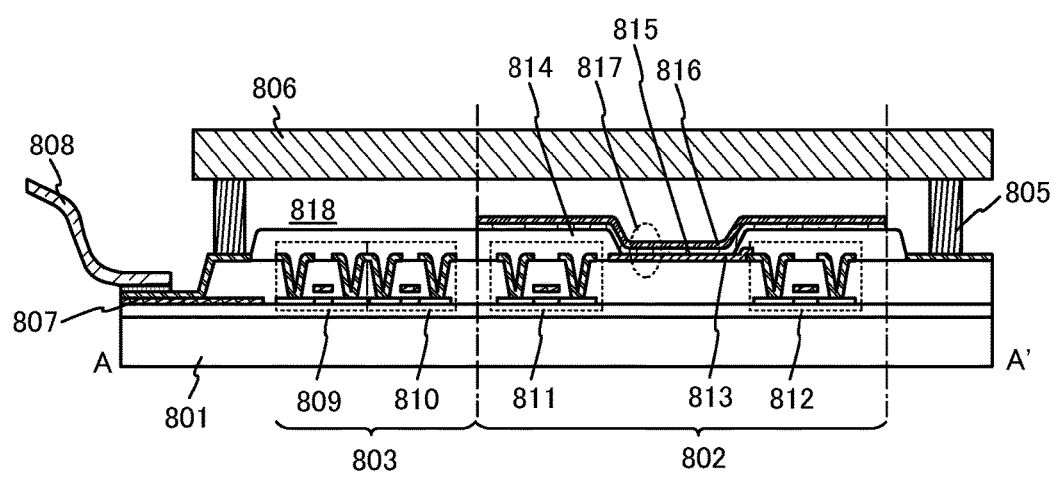

Next, an example of an active-matrix light-emitting device is described with reference to FIGS. 8A and 8B. Note that FIG. 8A is a top view illustrating a light-emitting device and FIG. 8B is a cross-sectional view taken along the chain line A-A' in FIG. 8A. The active-matrix light-emitting device of this embodiment includes a pixel portion 802 provided over an element substrate 801, a driver circuit portion (a source-side driver circuit) 803, and a driver circuit portion (a gate-side driver circuit) 804. The pixel portion 802, the driver circuit portion 803 and the driver circuit portion 804 are sealed between the element substrate 801 and the sealing substrate 806 by the sealing material 805.

In addition, over the element substrate 801, a lead wiring 807 for connecting an external input terminal which transmits a signal (e.g., a video signal, a clock signal, a start signal, or a reset signal) or an electric potential to the driver circuit portion 803 and the driver circuit portion 804 is provided. Here, an example is described in which a flexible printed circuit (FPC) 808 is provided as the external input terminal. Although only an FPC is shown here, this FPC may have a printed wiring board (PWB) attached. The "light-emitting device" in this specification includes not only a light-emitting device body but also a light-emitting device to which an FPC or a PWB is attached.

Next, the sectional structure will be described with reference to FIG. 8B. Although the driver circuit portions and the pixel portion are formed over the element substrate 801, the pixel portion 802 and the driver circuit portion 803 which is the source side driver circuit are illustrated here.

An example is illustrated in which a CMOS circuit which is a combination of an n-channel TFT 809 and a p-channel TFT 810 is formed as the driver circuit portion 803. Note that a circuit included in the driver circuit portion may be formed using various types of circuits such as a CMOS circuit, a PMOS circuit, or an NMOS circuit. Although a driver integrated type in which the driver circuit is formed over the substrate is described in this embodiment, the driver circuit may not necessarily be formed over the substrate, and the driver circuit can be formed outside, not over the substrate.

Further, the pixel portion 802 has a plurality of pixels, each including a switching TFT 811, a current-controlling TFT 812, and an anode 813 electrically connected to a wiring (a source electrode or a drain electrode) of the current-controlling TFT 812. An insulator 814 is formed so as to cover an end portion of the anode 813. In this embodiment, the insulator 814 is formed using a positive photosensitive acrylic resin.

The insulator 814 is preferably formed so as to have a curved surface with curvature at an upper end portion or a lower end portion thereof in order to obtain favorable coverage by a film which is to be stacked over the insulator 814. For example, in a case of using a positive photosensitive acrylic resin as a material for the insulator 814, the insulator 814 is preferably formed so as to have a curved surface with a curvature radius (0.2 to 3 μm) at the upper end portion thereof. Either a negative photosensitive material which becomes insoluble in an etchant by light or a positive photosensitive material which becomes soluble in an etchant by light can be used for the insulator 814. As the insulator 814, not only an organic compound but also an inorganic compound such as silicon oxide or silicon oxynitride can be used.

A layer including an organic compound 815 and a cathode 816 are stacked over the anode 813. Note that when an ITO film is used as the anode 813, and a stacked film of a titanium nitride film and a film containing aluminum as its main component or a stacked film of a titanium nitride film, a film containing aluminum as its main component, and a titanium nitride film is used as a wiring of the current-controlling TFT 812 which is connected to an anode 813, resistance of the wiring is low and favorable ohmic contact with the ITO film can be obtained. Note that, although not illustrated here, the cathode 816 is electrically connected to the FPC 808 which is an external input terminal.

In addition, the layer including an organic compound 815 described in this embodiment is a layer including the EL layer, the charge production region (including a first charge production region and a second charge production region), the electron-relay layer, and the electron-injecting buffer, which is described as the layer formed between the anode and the cathode in Embodiments 1 to 5. In the EL layer, at least the light-emitting layer is provided, and in addition to the light-emitting layer, a hole-injecting layer, a hole-transporting layer, an electron-transporting layer, and/or an electron-injecting layer are/is provided as appropriate. The stacked structure of the anode 813, the layer including an organic compound 815 and the cathode 816 corresponds to a light-emitting element 817.

Although only one light-emitting element 817 is illustrated in the cross-sectional view of FIG. 8B, a plurality of light-emitting elements are arranged in matrix in the pixel portion 802. Therefore, in the case of color display with color elements of R (red) G (green) and B (blue), plural light-emitting elements for emission colors of three colors (R, G, B) are formed in the pixel portion 802. In addition, the number of color elements is not limited to three, and four or more colors may be used or another color than RGB may be used. For example, RGBW (W means white) display becomes possible by addition of white.

As methods for fabricating light-emitting elements having different color elements, there are a method in which an EL layer for each color is separately formed, a method in which all EL layers for white emission are formed and color filters are used in combination to obtain light-emitting elements for different color elements, and a method in which all EL layers for blue emission or emission with a wavelength shorter than blue are formed and color conversion layers are used in combination to obtain light-emitting elements for different color elements, and the like.

Furthermore, the sealing substrate 806 and the element substrate 801 are attached to each other with the sealing material 805, whereby a light-emitting element 817 is provided in the space 818 surrounded by the element substrate 801, the sealing substrate 806, and the sealing material 805. Note that the space 818 may be filled with an inert gas (such as nitrogen or argon) or the sealing material 805.

It is preferable to use an epoxy resin for the sealing material 805. In addition, such a material as used for the sealing material 805 does not transmit moisture and oxygen as much as possible. As the sealing substrate 806, a plastic substrate formed of FRP (Fiberglass-Reinforced Plastics), PVF (polyvinyl fluoride), polyester, acrylic, or the like can be used besides a glass substrate or a quartz substrate.

As described above, an active matrix light-emitting device can be obtained.

Note that the structure described in Embodiment 6 can be combined with any structure of Embodiments 1 to 5 as appropriate.

Embodiment 7

In Embodiment 7, a variety of electronic devices and lighting devices which are manufactured using a light-emitting device formed according to one embodiment of the present invention are described using FIGS. 9A to 9E.

Examples of such electronic devices for which a light-emitting device according to one embodiment is used include television sets (also called TV or television receivers), monitors for computers or the like, cameras such as digital cameras or digital video cameras, digital photo frames, mobile phones (also called cellular phones or portable telephones), portable game machines, portable information terminals, audio playback devices, and large game machines such as pachinko machines. Specific examples of these electronic devices and lighting devices are illustrated in FIGS. 9A to 9E.

Figure 9A:
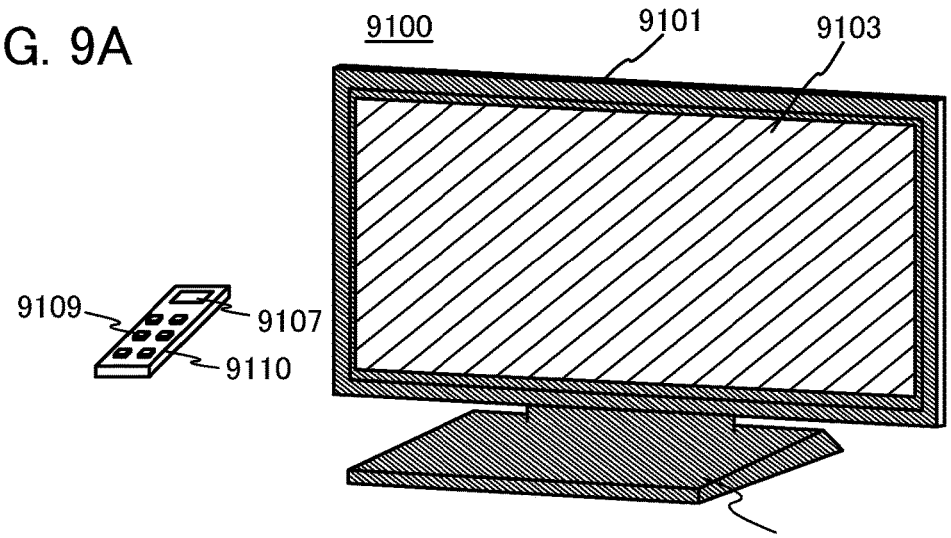
FIGS. 9A to 9E illustrate electronic devices.

FIG. 9A illustrates an example of a television set 9100. In the television set 9100, a display portion 9103 is incorporated in a housing 9101. The display portion 9103 can display images, and a light-emitting device formed according to one embodiment of the present invention can be used for the display portion 9103. In addition, the housing 9101 is supported by a stand 9105.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

Note that the television set 9100 is provided with a receiver, a modem, and the like. With the use of the receiver, general television broadcasting can be received. Furthermore, when the television set 9100 is connected to a communication network by wired or wireless connection via the modem, one-way (from a transmitter to a receiver) or two-way (between a transmitter and a receiver, between receivers, or the like) data communication can be performed.

In addition, the light-emitting device formed according to one embodiment of the present invention has lower power consumption. Thus, the light-emitting device is used for the display portion 9103 of the television set and thereby a long-lifetime television set can be provided.

Figure 9B:
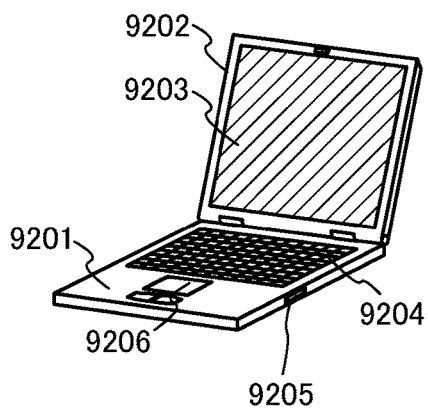

FIG. 9B illustrates a computer, which includes a main body 9201, a chassis 9202, a display portion 9203, a keyboard 9204, an external connection port 9205, a pointing device 9206, and the like. This computer is manufactured using a light-emitting device according to one embodiment of the present invention for the display portion 9203.

In addition, the light-emitting device formed according to one embodiment of the present invention has lower power consumption. Thus, the light-emitting device is used for the display portion 9203 of the computer and thereby a long-lifetime computer can be provided.

Figure 9C:
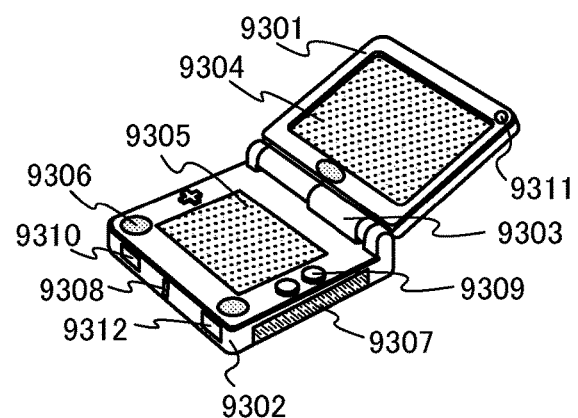

FIG. 9C illustrates a portable game machine including two housings, a housing 9301 and a housing 9302 which are jointed with a connector 9303 so as to be openable and closable. A display portion 9304 is incorporated in the housing 9301, and a display portion 9305 is incorporated in the housing 9302. In addition, the portable game machine illustrated in FIG. 9C is provided with a speaker portion 9306, a recording medium insert portion 9307, an LED lamp 9308, input means (operation keys 9309, a connection terminal 9310, a sensor 9311 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), and a microphone 9312), and the like. It is needless to say that the structure of the portable amusement machine is not limited to the above and other structures in which a light-emitting device formed according to one embodiment of the present invention is used for at least one or both of the display portion 9304 and the display portion 9305 may be employed. The portable amusement machine may include other accessory equipment as appropriate. The portable amusement machine illustrated in FIG. 9C has a function of reading a program or data stored in a recording medium to display it on the display portion, and a function of sharing information with another portable amusement machine by wireless communication. The portable game machine in FIG. 9C can have various functions without being limited to this example.

In addition, the light-emitting device formed according to one embodiment of the present invention has lower power consumption. Thus, the light-emitting device is used for the display portions (9304, 9305) of the portable amusement machine and thereby a long-lifetime portable amusement machine can be provided.

Figure 9D:
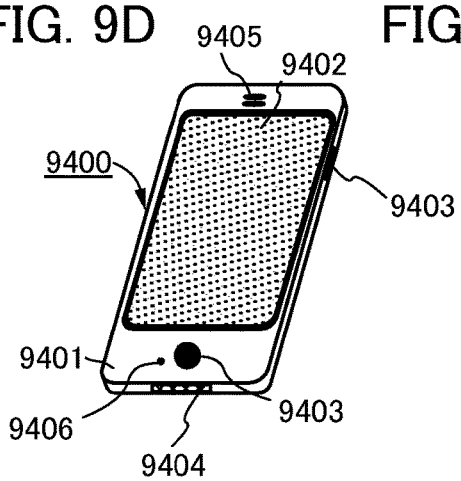

FIG. 9D illustrates an example of a mobile phone. The mobile phone 9400 is provided with a display portion 9402 incorporated in a housing 9401, operation buttons 9403, an external connection port 9404, a speaker 9405, a microphone 9406, and the like. Note that the mobile phone 9400 is manufactured using a light-emitting device formed according to one embodiment of the present invention for the display portion 9402.

When the display portion 9402 of the mobile phone 9400 illustrated in FIG. 9D is touched with a finger or the like, data can be input into the mobile phone 9400. Users can make a call or text messaging by touching the display portion 9402 with their fingers or the like.

There are mainly three screen modes of the display portion 9402. The first mode is a display mode mainly for displaying an image. The second mode is an input mode mainly for inputting information such as text. The third mode is a display-and-input mode in which two modes of the display mode and the input mode are mixed.

For example, in making a call or text messaging, the display portion 9402 is set to a text input mode where text input is mainly performed, and text input operation can be done on a screen. In this case, it is preferable to display a keyboard or number buttons on almost the entire screen of the display portion 9402.

When a detection device including a sensor for detecting inclination, such as a gyroscope or an acceleration sensor, is provided inside the mobile phone 9400, display on the screen of the display portion 9402 can be automatically switched by determining the direction of the mobile phone 9400 (whether the mobile phone is placed horizontally or vertically, e.g., a landscape mode or a portrait mode).

The screen modes are changed by touching the display portion 9402 or using the operation buttons 9403 of the housing 9401. Alternatively, the screen modes can be switched depending on kinds of images displayed in the display portion 9402. For example, when a signal for an image displayed in the display portion is data of moving images, the screen mode is switched to the display mode. When the signal is text data, the screen mode is switched to the input mode.

Furthermore, in the input mode, when input by touching the display portion 9402 is not performed for a certain period while a signal is detected by the optical sensor in the display portion 9402, the screen mode may be controlled so as to be switched from the input mode to the display mode.

The display portion 9402 can also function as an image sensor. For example, an image of a palm print, a fingerprint, or the like is taken by touching the display portion 9402 with the palm or the finger, whereby personal authentication can be performed. Furthermore, by providing a backlight or a sensing light source emitting a near-infrared light for the display portion, an image of a finger vein, a palm vein, or the like can also be taken.

In addition, the light-emitting device formed according to one embodiment of the present invention has lower power consumption. Thus, the light-emitting device is used for the display portion 9402 of the mobile phone 9400 and thereby a long-lifetime mobile phone can be provided.

Figure 9E:
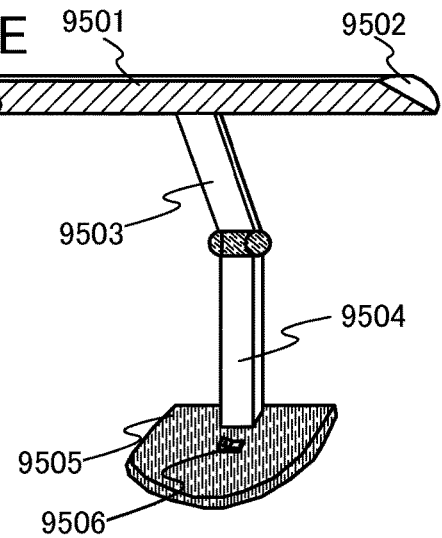

FIG. 9E illustrates a lighting device (a desk lamp) including a lighting portion 9501, a shade 9502, an adjustable arm 9503, a support 9504, a base 9505, and a power supply switch 9506. This lighting device is manufactured using a light-emitting device according to one embodiment of the present invention for the lighting portion 9501. Note that the term "lighting device" also encompasses ceiling lights (ceiling-fixed lighting devices), wall lights (wall-hanging lighting devices), and the like, as well as the desk lamp illustrated in FIG. 9E.

In addition, the light-emitting device formed according to one embodiment of the present invention has lower power consumption. Thus, the light-emitting device is used for the lighting portion 9501 of the lighting device (desk lamp) and thereby a long-lifetime lighting device (desk lamp) can be provided.

Figure 10:
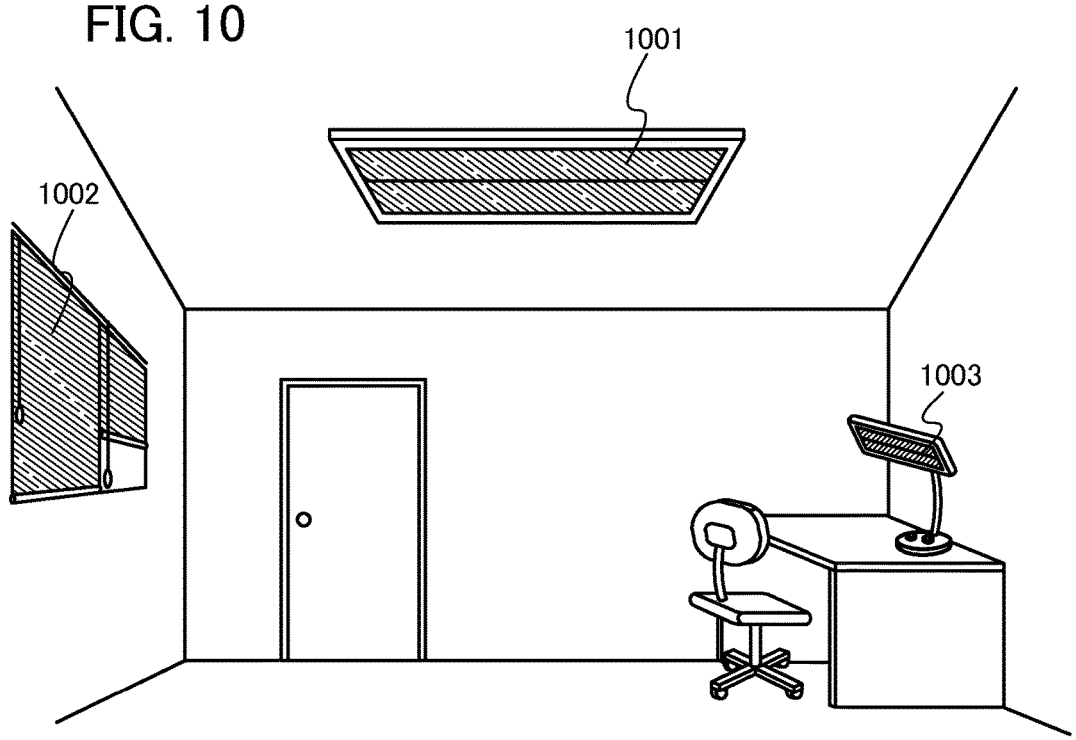
FIG. 10 illustrates a lighting device.

FIG. 10 illustrates an example in which a light-emitting device to which one embodiment of the present invention is applied is used as an interior lighting device. Since the light-emitting device of one embodiment of the present invention can also have a larger area, it can be used as a lighting device having a large area as illustrated by a ceiling light 1001. Additionally, the light-emitting device can be used as a wall light 1002. Since the light-emitting device formed according to one embodiment of the present invention has the light-emitting element with low driving voltage, it can be used as the lighting device with low power consumption. As illustrated in FIG. 10, a desk lamp 1003 illustrated in FIG. 9E may be used together in the room provided with the interior lighting device.

In the above-described manner, electronic devices or lighting devices can be obtained by application of a light-emitting device which is one embodiment of the present invention. As described above, the applicable range of the light-emitting device of one embodiment of the present invention is so wide that the light-emitting device can be applied to electronic devices in a variety of fields.

Note that the structure described in this embodiment can be combined with any of the structures shown in Embodiments 1 to 6 as appropriate.

EXAMPLES

Example 1

In Example 1, a light-emitting element according to one embodiment of the present invention will be described. Structural formulae of materials used in this example are shown below.

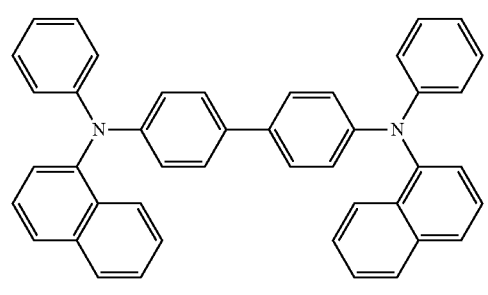

NPB

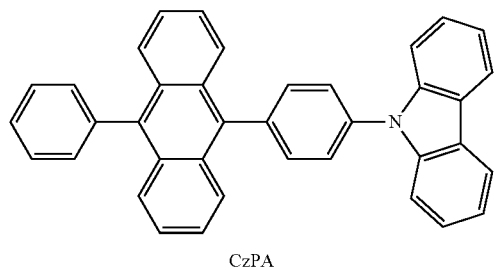

CzPA

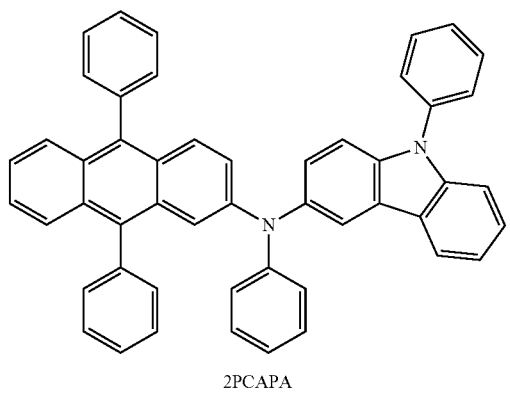

2PCAPA

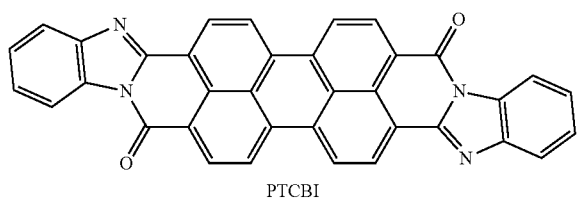

PTCBI

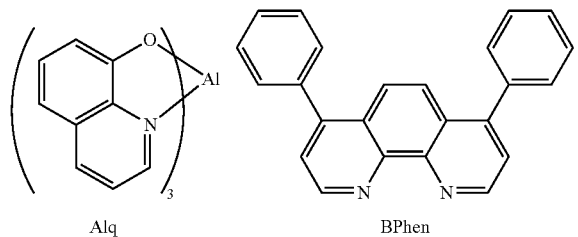

Alq                BPhen (Fabrication of Light-Emitting Element A)

First, indium tin oxide containing silicon or silicon oxide was deposited to a thickness of 110 nm over a glass substrate by a sputtering method to form an anode (an electrode area: 2 mm×2 mm).

Next, the glass substrate provided with the anode was fixed to a substrate holder provided in a vacuum evaporation apparatus such that the side on which the anode was formed faced downward. The vacuum evaporation apparatus was evacuated to approximately $10^{-4}$ Pa, and then, a first charge production region was formed by co-evaporation of 4,4'-bis[N-(1-naphtyl)-N-phenylamino]biphenyl (abbreviation: NPB) as a high hole-transporting substance and molybdenum(VI) oxide as an acceptor substance. The film thickness of the first charge production region was 50 nm, and the weight ratio between NPB and molybdenum(VI) oxide was set to 4:1 (=NPB: molybdenum oxide). Note that the co-evaporation method is an evaporation method in which evaporation is carried out from a plurality of evaporation sources at the same time in one treatment chamber.

Next, NPB was formed to a thickness of 10 nm by an evaporation method using resistance heating to form a hole-transporting layer.

Next, 9-[4-(10-phenyl-9-antryl)phenyl]-9H-carbazole (abbreviation: CzPA) and N-(9,10-diphenyl-2-anthryl)-N,9-diphenyl-9H-carbazol-3-amine (2PCAPA) were co-evaporated with the weight ratio of CzPA:2PCAPA=1:0.05 to form the light-emitting layer. CzPA is an electron-transporting substance and 2PCAPA is a substance which emits green light. The thickness of the light-emitting layer was 30 nm.

After that, by an evaporation method using resistance heating, tris(8-quinolinolato)aluminum (Alq) was deposited to a thickness of 10 nm, and then bathophenanthroline (BPhen) was deposited to a thickness of 10 nm to form an electron-transporting layer.

Then, lithium oxide ($Li_2O$) was deposited to a thickness of about 0.1 nm to form an electron-injecting buffer by an evaporation method using resistance heating similarly, and then 3,4,9,10-perylenetetracarboxylicbisbenzimidazole (abbreviation: PTCBI) was deposited to a thickness of about 3 nm to form an electron-relay layer by an evaporation method using resistance heating similarly.

Then, 4,4'-bis[N-(1-naphtyl)-N-phenylamino]biphenyl (abbreviation: NPB) as a high hole-transporting substance and molybdenum(VI) oxide as an acceptor substance were co-evaporated to form a second charge production region. The thickness was 20 nm, and the weight ratio between NPB and molybdenum(VI) oxide was set 4:1 (=NPB: molybdenum oxide).

Next, a 200-nm-thick aluminum film was deposited to form a cathode, so that the light-emitting element A was fabricated.

(Fabrication of a Reference Light-Emitting Element a-1)

Steps up to formation of an electron-injecting buffer were conducted in a manner similar to the light-emitting element A. Then, a cathode was formed without formation of an electron-relay layer and a second charge production region, and the thus formed light-emitting element was regarded as the reference light-emitting element a-1.

(Fabrication of a Reference Light-Emitting Element a-2)

Steps up to formation of an electron-injecting buffer layer were conducted in a manner similar to the light-emitting element A. Then, a second charge production region and a cathode were formed without formation of an electron-relay layer, and the thus formed light-emitting element was regarded as the reference light-emitting element a-2.

Table 1 below shows structural parts of the light-emitting element A, the reference light-emitting element a-1, and the reference light-emitting element a-2. Note that the light-emitting elements all have the same structures of anode, first charge production region, hole-transporting layer, light-emitting layer, and electron-transporting layer, and description of the first charge production region, hole-transporting layer, light-emitting layer and electron-transporting layer is omitted.

TABLE 1

| | anode | * | electron-injecting buffer layer | electron-relay layer | second charge production region | cathode |
|---|---|---|---|---|---|---|
| A | ITO (110 nm) | ** | Li$_2$O(0.1 nm) | PTCBI(3 nm) | NPB:MoO$_x$(20 nm 4:1) | Al (200 nm) |
| a-1 | | | | — | — | |
| a-2 | | | | — | NPB:MoO$_x$(20 nm 4:1) | |

* first charge production region, hole-transporting layer, light-emitting layer, and electron-transporting layer are omitted
** description of material and thickness are omitted The thus formed light-emitting element A, reference light-emitting element a-1, and reference light-emitting element a-2 were sealed so that the light-emitting elements were not exposed to atmospheric air in a glove box under a nitrogen atmosphere. Then, the operating characteristics of the light-emitting elements were measured. The measurement was carried out at room temperature (under an atmosphere kept at 25° C.).

Figure 11:
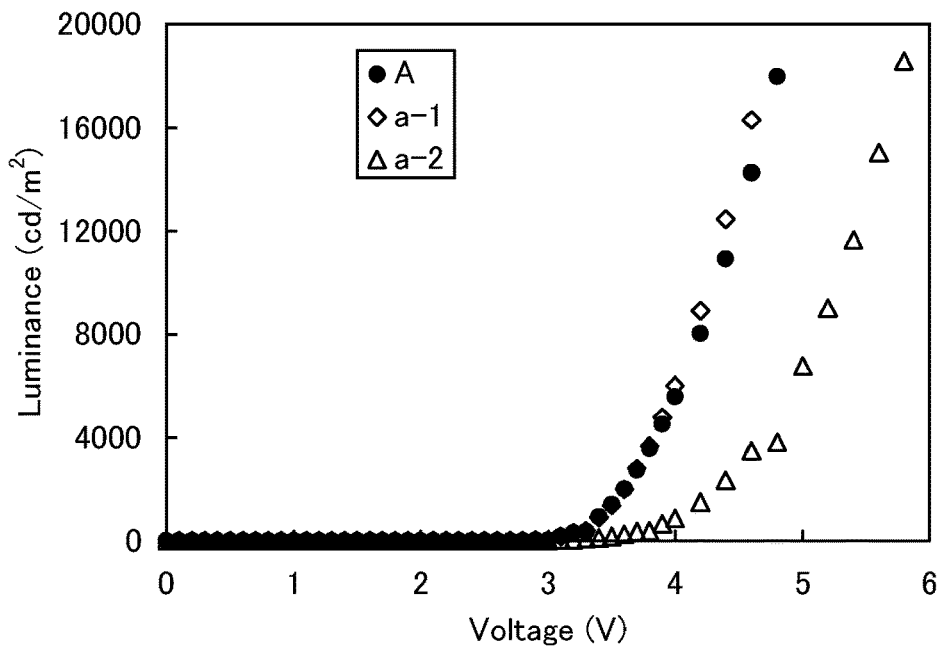
FIG. 11 shows characteristics of light-emitting elements of Examples.
Figure 12:
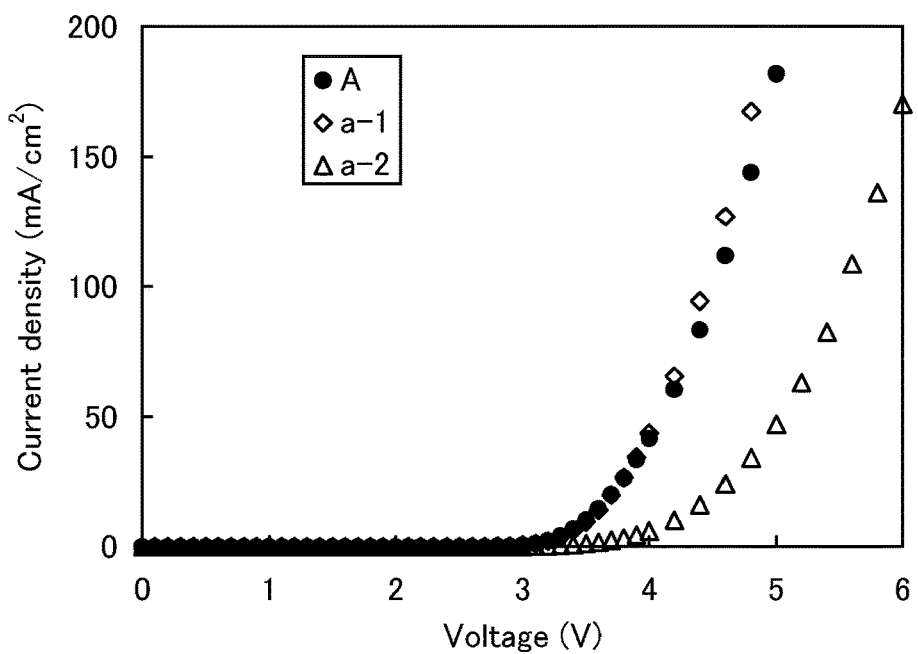
FIG. 12 shows characteristics of the light-emitting elements of Examples.

FIG. 11 and FIG. 12 show voltage-luminance characteristics and voltage-current density characteristics of the light-emitting element A, reference light-emitting element a-1, and reference light-emitting element a-2, respectively. Table 2 shows initial values of main characteristics of the light-emitting elements at around 1000 cd/m$^2$.

TABLE 2

| | voltage (V) | chromaticity (x, y) | current efficiency (cd/A) | external quantum efficiency (%) |
|---|---|---|---|---|
| A | 3.4 | (0.29, 0.61) | 14 | 4.1 |
| a-1 | 3.4 | (0.28, 0.62) | 14 | 4.2 |
| a-2 | 3.9 | (0.29, 0.61) | 15 | 4.4 |

As apparent from FIG. 11, the light-emitting element A has a different structure from the reference light-emitting element a-1 and an increased thickness between electrodes, but can have substantially the same luminance with respect to the same voltage, as the reference light-emitting element a-1. In addition, as comparison with the reference light-emitting element a-2, high luminance with respect to the same voltage can be obtained by provision of the electron-relay layer. Note that green emission at a wavelength of around 520 nm from 2PCAPA as the light-emitting substance of all the light-emitting elements can be obtained.

In addition, also from the voltage-current density characteristics shown in FIG. 12, it is apparent that the light-emitting element A has substantially the same current density as the reference light-emitting element a-1. Additionally, current efficiencies of the light-emitting element A, the reference light-emitting element a-1, and the reference light-emitting element a-2 are about 14 cd/A at 1000 cd/m$^2$, which are substantially the same for the light-emitting elements.

From the above-described results, even when the thickness of the layer including an organic compound provided between the electrodes of the light-emitting element is changed, the increase of driving voltage can be suppressed.

Example 2

In Example 2, a light-emitting element of one embodiment of the present invention will be described. Structural formulae of materials used in Example 2 are referred to those in Example 1, and description thereof is omitted in Example 2.

(Fabrication of a Light-Emitting Element B)

After an anode, a first charge production region, a hole-transporting layer, and a light-emitting layer are formed using materials similar to and by a method similar to those of the light-emitting element A described in Example 1, tris(8-quinolinolato)aluminum (abbreviation: Alq) was deposited to a thickness of 10 nm to form an electron-transporting layer by an evaporation method using resistance heating.

Next, by an evaporation method using resistance heating, bathophenanthroline (abbreviation: BPhen) and lithium (Li) were co-evaporated to form an electron-injecting buffer. The thickness was 10 nm and the weight ratio of BPhen to lithium was adjusted to 1:0.02 (=BPhen: lithium).

Then, similar to the light-emitting element A, an electron-relay layer, a second charge production region and a cathode were sequentially formed to fabricate the light-emitting element B.

(Fabrication of a Reference Light-Emitting Element b-1)

Steps up to formation of an electron-injecting buffer were conducted in a manner similar to the light-emitting element B. Then, a cathode was formed without formation of an electron-relay layer and a second charge production region, and the thus formed light-emitting element was regarded as the reference light-emitting element b-1.

(Fabrication of a Reference Light-Emitting Element b-2)

Steps up to formation of an electron-injecting buffer layer were conducted in a manner similar to the light-emitting element B. Then, a second charge production region and a cathode were formed without formation of an electron-relay layer, and the thus formed light-emitting element was regarded as the reference light-emitting element b-2.

Table 3 below shows structural parts of the light-emitting element B, the reference light-emitting element b-1, and the reference light-emitting element b-2. Note that the light-emitting elements all have the same structures of anode, first charge production region, hole-transporting layer, light-emitting layer, and electron-transporting layer, and thus description of the first charge production region, hole-transporting layer, light-emitting layer and electron-transporting layer is omitted.

TABLE 3

| anode | * | electron-injecting buffer layer | electron-relay layer | second charge production region | cathode |
|---|---|---|---|---|---|
| B | NITO (110 nm) | ** | Bphen:Li(10 nm 1:0.02) | PTCBI(3 nm) | NPB:MoO$_x$(20 nm 4:1) | Al (200 nm) |
| b-1 | | | | — | — | |
| b-2 | | | | — | NPB:MoO$_x$(20 nm 4:1) | |

* first charge production region, hole-transporting layer, light-emitting layer, and electron-transporting layer are omitted
** description of material and thickness are omitted The thus formed light-emitting element B, reference light-emitting element b-1, and reference light-emitting element b-2 were sealed so that the light-emitting elements were not exposed to atmospheric air in a glove box under a nitrogen atmosphere. Then, the operating characteristics of the light-emitting elements were measured. The measurement was carried out at room temperature (under an atmosphere kept at 25° C.).

Figure 13:
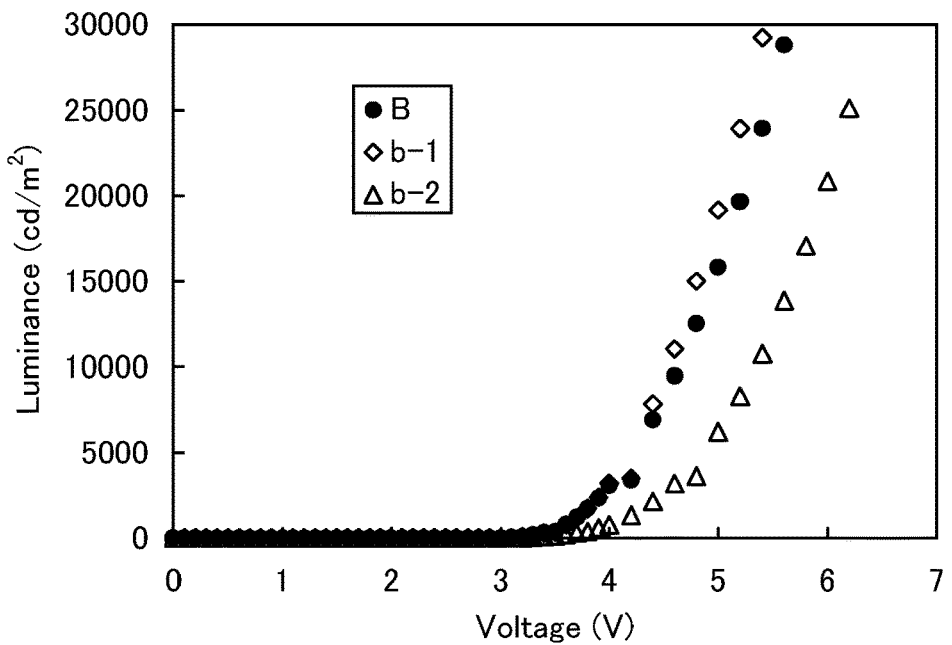
FIG. 13 shows characteristics of light-emitting elements of Examples.
Figure 14:
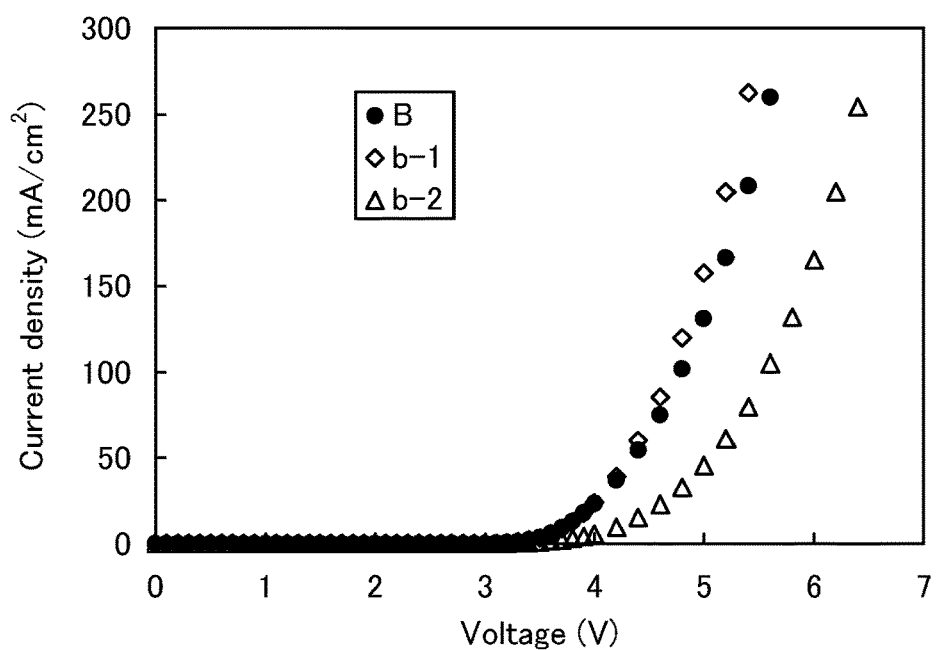
FIG. 14 shows characteristics of the light-emitting elements of Examples.

FIG. 13 and FIG. 14 show voltage-luminance characteristics and voltage-current density characteristics of the light-emitting element B, reference light-emitting element b-1, and reference light-emitting element b-2, respectively. Table 4 shows initial values of main characteristics of the light-emitting elements at around 1000 cd/m$^2$.

TABLE 4

| | voltage (V) | chromaticity (x, y) | current efficiency (cd/A) | external quantum efficiency (%) |
|---|---|---|---|---|
| B | 3.6 | (0.29, 0.61) | 13 | 3.9 |
| b-1 | 3.7 | (0.28, 0.62) | 14 | 4.0 |
| b-2 | 4.0 | (0.29, 0.61) | 14 | 4.1 |

As apparent from FIG. 13, the light-emitting element B has a different structure from the reference light-emitting element b-1 and an increased thickness between electrodes, but can have substantially the same luminance with respect to voltage, as the reference light-emitting element b-1. In addition, as comparison with the reference light-emitting element b-2, high luminance with respect to voltage can be obtained by provision of the electron-relay layer. Note that green emission at a wavelength of around 520 nm from 2PCAPA as the light-emitting substance of all the light-emitting elements can be obtained.

In addition, also from the voltage-current density characteristics shown in FIG. 14, it is apparent that the light-emitting element B has substantially the same current density as the reference light-emitting element b-1. Additionally, current efficiencies of the light-emitting element B, the reference light-emitting element b-1, and the reference light-emitting element b-2 are about 14 cd/A at 1000 cd/m$^2$, which are substantially the same for the light-emitting elements.

From the above-described results, even when the thickness of the layer including an organic compound provided between the electrodes of the light-emitting element is changed, the increase of driving voltage can be suppressed.

Example 3

In Example 3, a light-emitting element of one embodiment of the present invention will be described. Structural formulae of materials used in Example 3 are referred to those in Example 1, and description thereof is omitted in Example 3.

(Fabrication of a Light-Emitting Element C)

After an anode, a first charge production region, a hole-transporting layer, a light-emitting layer, an electron-transporting layer, an electron-injecting buffer, and an electron relay layer were formed using materials similar to and by a method similar to those of the light-emitting element A described in Example 1, tris(8-quinolinolato)aluminum (abbreviation: Alq) was deposited to a thickness of 10 nm by an evaporation method using resistance heating and similarly bathophenanthroline (abbreviation: BPhen) was deposited to a thickness of 10 nm by an evaporation method using resistance heating to form an electron-transporting layer.

Next, by an evaporation method using resistance heating, molybdenum(VI) oxide as an acceptor substance was deposited to a thickness of 10 nm, and then, 4,4'-bis[N-(1-naphthyl)-N-phenylamino]biphenyl (abbreviation: NPB) which was a high hole-transporting substance by an evaporation method using resistance heating was similarly deposited to a thickness of 10 nm to form a second charge production region.

Then, a 200-nm-thick aluminum film was deposited to form a cathode, so that the light-emitting element C was fabricated.

(Fabrication of a Reference Light-Emitting Element c-1)

Steps up to formation of an electron-injecting buffer were conducted in a manner similar to the light-emitting element C. Then, a second charge production region and a cathode were formed without formation of an electron-relay layer, and the thus formed light-emitting element was regarded as the reference light-emitting element c-1.

Table 5 below shows structural parts of the light-emitting element C, and the reference light-emitting element c-1. Note that the light-emitting elements both have the same structure of anode, first charge production region, hole-transporting layer, light-emitting layer, electron-transporting layer, and electron-injecting buffer and description of the first charge production region, hole-transporting layer, light-emitting layer and electron-transporting layer is omitted.

TABLE 5

| | anode | * | electron-injecting buffer layer | electron-relay layer | second charge production region | | cathode |
|---|---|---|---|---|---|---|---|
| C | NITO (110 nm) | ** | Li$_2$O(0.1 nm) | PTCBI(3 nm) | MoO$_x$(10 nm) | NPB(10 nm) | Al |
| c-1 | | | | — | MoO$_x$(10 nm) | NPB(10 nm) | (200 nm) |

* first charge production region, hole-transporting layer, light-emitting layer, and electron-transporting layer are omitted
** description of material and thickness are omitted The thus formed light-emitting element C, and reference light-emitting element c-1 were sealed so that the light-emitting elements were not exposed to atmospheric air in a glove box under a nitrogen atmosphere. Then, the operating characteristics of the light-emitting elements were measured. The measurement was carried out at room temperature (under an atmosphere kept at 25° C.).

Figure 15:
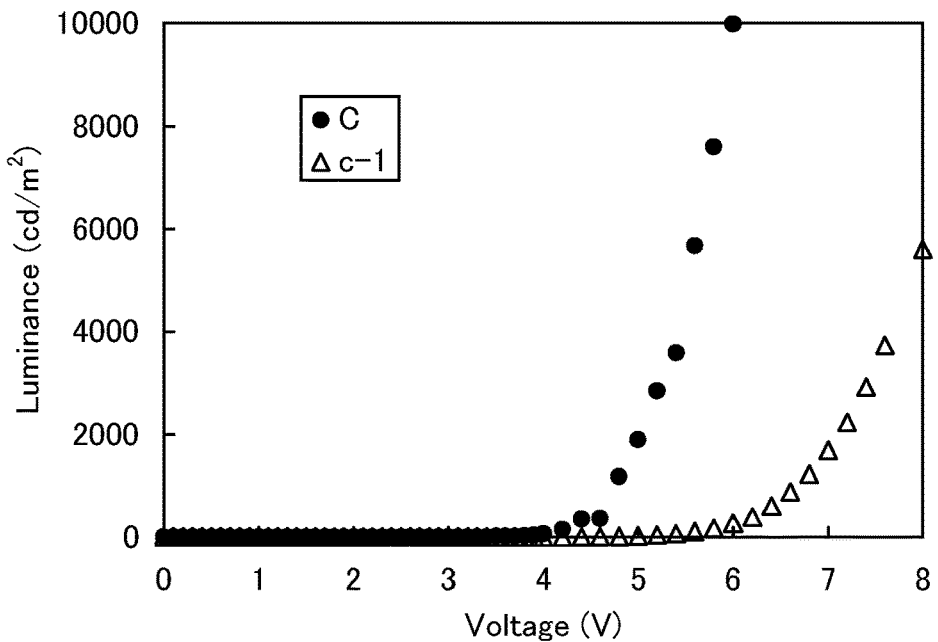
FIG. 15 shows characteristics of light-emitting elements of Examples.
Figure 16:
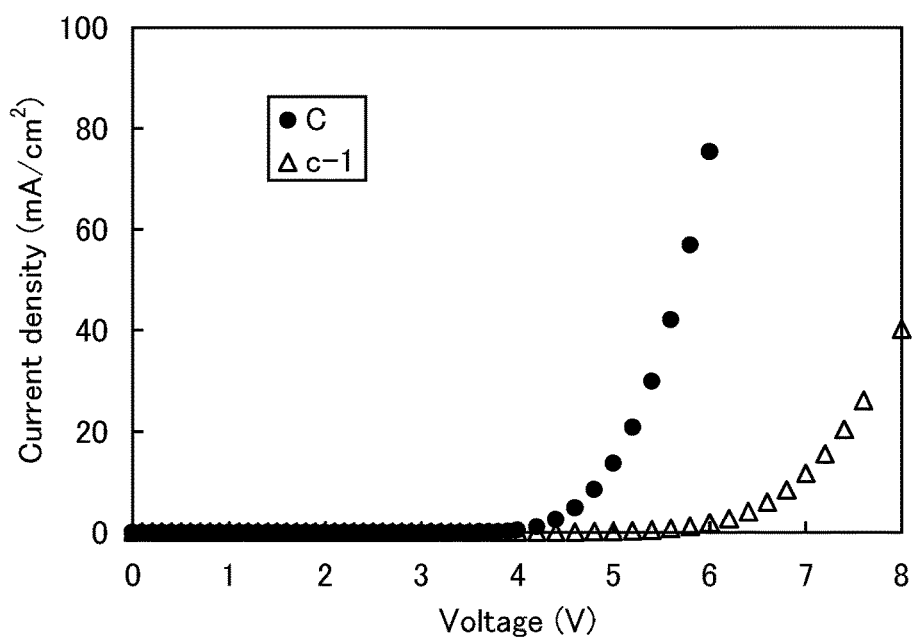
FIG. 16 shows characteristics of the light-emitting elements of Examples.

FIG. 15 and FIG. 16 show voltage-luminance characteristics and voltage-current density characteristics of the light-emitting element C and reference light-emitting element c-1, respectively. Table 6 shows initial values of main characteristics of the light-emitting elements at around 1000 cd/m$^2$.

TABLE 6

|   | voltage (V) | chromaticity (x, y) | current efficiency (cd/A) | external quantum efficiency (%) |
|---|---|---|---|---|
| C | 4.8 | (0.29, 0.61) | 14 | 4.1 |
| c-1 | 6.6 | (0.29, 0.62) | 15 | 4.3 |

As apparent from FIG. 15, the light-emitting element C has higher luminance than the reference light-emitting element c-1 with respect to the same voltage. This is thought to be as a result from that carrier transfer can be conducted smoothly inside the light-emitting element by provision of the electron-relay layer. Note that green emission at a wavelength of around 520 nm from 2PCAPA as the light-emitting substance of both the light-emitting elements can be obtained.

In addition, also from the voltage-current density characteristics shown in FIG. 16, it is apparent that the light-emitting element C has higher current density than the reference light-emitting element c-1. Additionally, current efficiencies of the light-emitting element C and the reference light-emitting element c-1 are about 14 cd/A at 1000 cd/m$^2$, which are substantially the same for the light-emitting elements.

From the above-described results, by provision of the electron-relay layer, electron injection into the EL layer of the light-emitting element can be facilitated, and thus the increase of driving voltage can be suppressed.

Example 4

In Example 4, a light-emitting element of one embodiment of the present invention will be described. Structural formulae of materials used in Example 4 are referred to those in Example 1, and description thereof is omitted in Example 4.

(Fabrication of a Light-Emitting Element D)

After an anode, a first charge production region, a hole-transporting layer, a light-emitting layer, an electron-transporting layer, an electron-injecting buffer, and an electron relay layer were formed using materials similar to and by a method similar to those of the light-emitting element B described in Example 2, molybdenum(VI) oxide which was an acceptor substance was deposited to a thickness of 10 nm by an evaporation method using resistance heating and 4,4'-bis[N-(1-naphtyl)-N-phenylamino]biphenyl (abbreviation: NPB) which was a high hole-transporting substance by an evaporation method using resistance heating was similarly deposited to a thickness of 10 nm to form a second charge production region.

Then, a 200-nm-thick aluminum film was deposited to form a cathode, so that the light-emitting element D was fabricated.

(Fabrication of a Reference Light-Emitting Element d-1)

Steps up to formation of an electron-injecting buffer were conducted in a manner similar to the light-emitting element D. Then, a second charge production region and a cathode were formed without formation of an electron-relay layer, and the thus formed light-emitting element was regarded as the reference light-emitting element d-1.

Table 7 below shows structural parts of the light-emitting element D and the reference light-emitting element d-1. Note that the light-emitting elements both have the same structure of anode, first charge production region, hole-transporting layer, light-emitting layer, electron-transporting layer, and electron-injecting buffer and description of the first charge production region, hole-transporting layer, light-emitting layer and electron-transporting layer is omitted.

TABLE 7

|   | anode | * | electron-injecting buffer layer | electron-relay layer | second charge production region | | cathode |
|---|---|---|---|---|---|---|---|
| D | NITO (110 nm) | ** | Bphen:Li(10 nm) 1:0.02) | PTCBI(3 nm) | MoO$_x$(10 nm) | NPB(10 nm) | Al (200 nm) |
| d-1 |   |   |   | — | MoO$_x$(10 nm) | NPB(10 nm) |   |

* first charge production region, hole-transporting layer, light-emitting layer, and electron-transporting layer are omitted
** description of material and thickness are omitted The thus formed light-emitting element D and reference light-emitting element d-1 were sealed so that the light-emitting elements were not exposed to atmospheric air in a glove box under a nitrogen atmosphere. Then, the operating characteristics of the light-emitting elements were measured. The measurement was carried out at room temperature (under an atmosphere kept at 25° C.).

Figure 17:
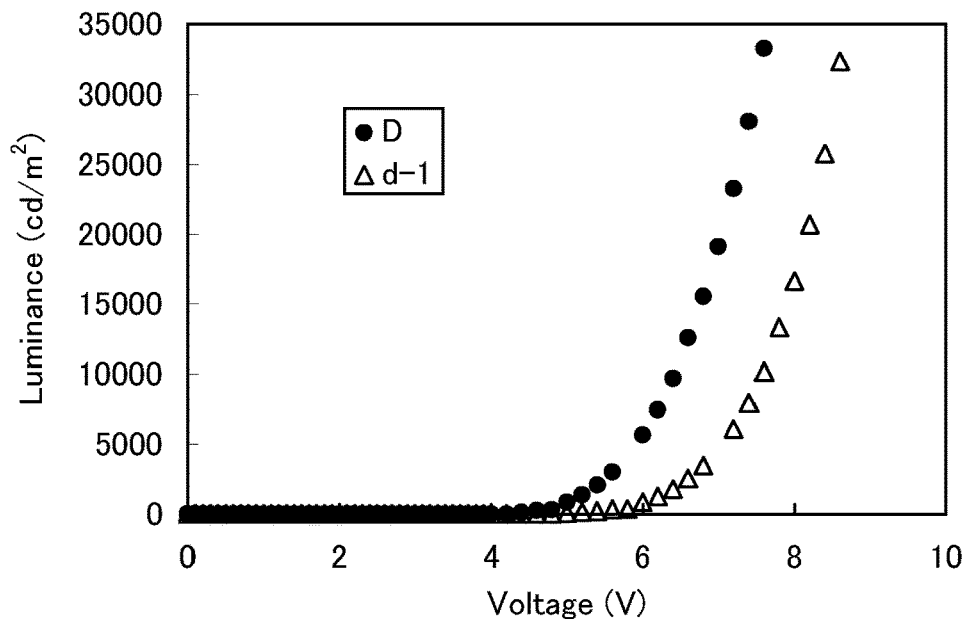
FIG. 17 shows characteristics of light-emitting elements of Examples.
Figure 18:
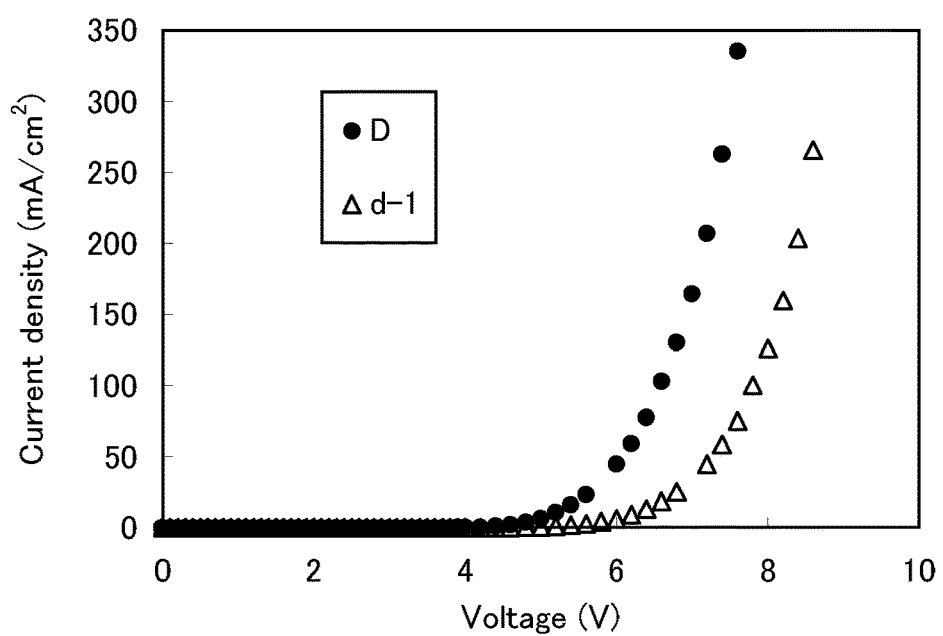
FIG. 18 shows characteristics of the light-emitting elements of Examples.

FIG. 17 and FIG. 18 show voltage-luminance characteristics and voltage-current density characteristics of the light-emitting element D and reference light-emitting element d-1, respectively. Table 8 shows initial values of main characteristics of the light-emitting elements at around 1000 cd/m$^2$.

TABLE 8

|   | voltage (V) | chromaticity (x, y) | current efficiency (cd/A) | external quantum efficiency (%) |
|---|---|---|---|---|
| D | 5.0 | (0.29, 0.61) | 13 | 3.9 |
| d-1 | 6.0 | (0.29, 0.61) | 13 | 4.1 |

As apparent from FIG. 17, the light-emitting element D has higher luminance than the reference light-emitting element d-1 with respect to the same voltage. This is thought to be as a result from that carrier transfer can be conducted smoothly inside the light-emitting element by provision of the electron-relay layer. Note that green emission at a wavelength of around 520 nm from 2PCAPA as the light-emitting substance of both the light-emitting elements can be obtained.

In addition, also from the voltage-current density characteristics shown in FIG. 18, it is apparent that the light-emitting element D has higher current density than the reference light-emitting element d-1. Additionally, current efficiencies of the light-emitting element D and the reference light-emitting element d-1 are about 13 cd/A at 1000 cd/m², which are substantially the same for the light-emitting elements.

From the above-described results, by provision of the electron-relay layer, electron injection into the EL layer of the light-emitting element can be facilitated and thus the increase of driving voltage can be suppressed.

This application is based on Japanese Patent Application Serial No. 2008-306153 filed with Japan Patent Office on Dec. 1, 2008, and Japanese Patent Application Serial No. 2009-130539 filed with Japan Patent Office on May 29, 2009, the entire contents of which are hereby incorporated by reference.

What is claimed is:

1. A light-emitting device comprising:
an anode over a substrate;
an EL layer over the anode, the EL layer comprising a light-emitting layer and an electron-transporting layer;
a first layer over the EL layer, the first layer comprising at least one of an alkali metal, an alkaline earth metal, an alkali metal compound, and an alkaline earth metal compound;
a second layer over and in direct contact with the first layer, the second layer comprising a first material having an electron-transporting property;
a third layer over and in direct contact with the second layer, the third layer comprising an acceptor substance and a second material having a hole-transporting property; and
a cathode over the third layer,
wherein the electron-transporting layer is provided between the light-emitting layer and the first layer, and
wherein a LUMO level of the first material is higher than an acceptor level of the acceptor substance.

2. The light-emitting device according to claim 1, wherein the LUMO level of the first material is −5.0 eV or higher.

3. The light-emitting device according to claim 1, wherein the first material is a perylene derivative or a compound having a nitrogen-containing condensed aromatic ring.

4. The light-emitting device according to claim 1,
wherein the acceptor substance is a metal oxide, and
wherein the metal oxide is an oxide of a metal belonging to Groups 4 to 8 in the periodic table.

5. The light-emitting device according to claim 1,
wherein the acceptor substance is a metal oxide, and
wherein the metal oxide is molybdenum oxide.

6. The light-emitting device according to claim 1, wherein a thickness of the third layer is 1 nm or smaller.

7. An electronic device comprising:
the light-emitting device according to claim 1; and
a housing.

8. A lighting device comprising:
a power supply switch; and
a lighting portion comprising:
an anode over a substrate;
an EL layer over the anode, the EL layer comprising a light-emitting layer and an electron-transporting layer;
a first layer over the EL layer, the first layer comprising at least one of an alkali metal, an alkaline earth metal, an alkali metal compound, and an alkaline earth metal compound;
a second layer over and in direct contact with the first layer, the second layer comprising a first material having an electron-transporting property;
a third layer over and in direct contact with the second layer, the third layer comprising an acceptor substance and a second material having a hole-transporting property; and
a cathode over the third fourth layer,
wherein the electron-transporting layer is provided between the light-emitting layer and the first layer, and
wherein a LUMO level of the first material is higher than an acceptor level of the acceptor substance.

9. The lighting device according to claim 8, wherein the LUMO level of the first material is −5.0 eV or higher.

10. The lighting device according to claim 8, wherein the first material is a perylene derivative or a compound having a nitrogen-containing condensed aromatic ring.

11. The lighting device according to claim 8,
wherein the acceptor substance is a metal oxide, and
wherein the metal oxide is an oxide of a metal belonging to Groups 4 to 8 in the periodic table.

12. The lighting device according to claim 8,
wherein the acceptor substance is a metal oxide, and
wherein the metal oxide is molybdenum oxide.

13. The lighting device according to claim 8, wherein a thickness of the third layer is 1 nm or smaller.

14. A light-emitting device comprising:
an anode over a substrate;
an EL layer over the anode, the EL layer comprising a light-emitting layer and an electron-transporting layer;
a first layer over the EL layer, the first layer comprising at least one of an alkali metal, an alkaline earth metal, an alkali metal compound, and an alkaline earth metal compound;
a second layer over and in direct contact with the first layer, the second layer comprising a perylene derivative having an electron-transporting property;
a third layer over and in direct contact with the second layer, the third layer comprising an acceptor substance and a second material having a hole-transporting property; and
a cathode over the third layer,
wherein the electron-transporting layer is provided between the light-emitting layer and the first layer.

15. The light-emitting device according to claim 14, wherein a LUMO level of the perylene derivative is −5.0 eV or higher.

16. The light-emitting device according to claim 14,
wherein the acceptor substance is a metal oxide, and
wherein the metal oxide is an oxide of a metal belonging to Groups 4 to 8 in the periodic table.

17. The light-emitting device according to claim 14,
wherein the acceptor substance is a metal oxide; and
wherein the metal oxide is molybdenum oxide.

18. The light-emitting device according to claim 14,
wherein a thickness of the third layer is 1 nm or smaller.

19. A lighting device comprising:
the light-emitting device according to claim 14; and
a power supply switch.

20. An electronic device comprising:
the light-emitting device according to claim 14; and
a housing.

* * * * *